(12) United States Patent
Whitcombe et al.

(10) Patent No.: US 12,189,344 B2
(45) Date of Patent: Jan. 7, 2025

(54) TIME-TO-DIGITAL CONVERTER AND COMPARATOR-BASED REFERENCE VOLTAGE GENERATOR

(71) Applicant: Intel Corporation, Santa Clara, CA (US)

(72) Inventors: Amy Whitcombe, Saratoga, CA (US); Brent Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 17/342,397

(22) Filed: Jun. 8, 2021

(65) Prior Publication Data

US 2023/0018398 A1 Jan. 19, 2023

(51) Int. Cl.
*G04F 10/00* (2006.01)
*G05F 1/575* (2006.01)
*H03K 19/20* (2006.01)
*H03M 1/38* (2006.01)

(52) U.S. Cl.
CPC ............ *G04F 10/005* (2013.01); *G05F 1/575* (2013.01); *H03M 1/38* (2013.01); *H03K 19/20* (2013.01)

(58) Field of Classification Search
CPC .... H03M 1/38; H03M 1/0624; H03M 1/1215; H03M 1/466
See application file for complete search history.

(56) References Cited

U.S. PATENT DOCUMENTS

| | | | | |
|---|---|---|---|---|
| 5,416,913 A | * | 5/1995 | Grochowski | ....... G06F 9/30145 |
| | | | | 712/216 |
| 5,968,163 A | * | 10/1999 | Narayan | ................... G06F 9/28 |
| | | | | 712/213 |
| 6,353,805 B1 | * | 3/2002 | Zahir | .................. G06F 11/3466 |
| | | | | 702/182 |

(Continued)

OTHER PUBLICATIONS

Bang, Suyoung et al., "A Fully Synthesizable Distributed and Scalable All-Digital LDO in 10nm CMOS", ISSCC 2020, Session 25, Digital Power Delivery & Clocking Circuits, 25.1, 3 pgs.

(Continued)

*Primary Examiner* — Lam T Mai
(74) *Attorney, Agent, or Firm* — Schwabe, Williamson & Wyatt, P.C.

(57) ABSTRACT

A time-to-digital converter (TDC) that combines the energy efficiency of a successive approximation (SAR) design with the high speed of pipelined converters by leveraging the inherently pipelined nature of time-domain signaling. The TDC achieves high speed by removing a comparator decision from a signal path, instead using AND/OR gates to separate early and late edges. The TDC uses a pipelined SAR architecture to digitize a differential delay between two incoming clock edges with high speed and low power consumption. Described is a modular digital reference voltage generator that can be used for a capacitive digital-to-analog converter (DAC). The generator comprises a decoupling capacitor, one or more clocked comparators, and power transistor(s). A simplified digital low dropout (LDO) circuitry is used to provide fast reference voltage generation with minimal overhead. The LDO circuitry is arrayed using time-interleaved synchronous clocks or staggered asynchronous clocks to provide finer timing resolution.

20 Claims, 16 Drawing Sheets

(56) References Cited

U.S. PATENT DOCUMENTS

| | | | | |
|---|---|---|---|---|
| 6,609,209 | B1* | 8/2003 | Tiwari | G06F 1/3228 |
| | | | | 713/322 |
| 7,028,281 | B1* | 4/2006 | Agrawal | H03K 19/17784 |
| | | | | 326/41 |
| 10,642,227 | B1* | 5/2020 | Lin | G04F 10/005 |
| 11,293,977 | B2* | 4/2022 | Fayneh | G01R 31/3016 |
| 2011/0084863 | A1* | 4/2011 | Chiu | G04F 10/005 |
| | | | | 341/166 |
| 2015/0006944 | A1* | 1/2015 | Russell | G06F 1/3203 |
| | | | | 713/501 |
| 2015/0042501 | A1* | 2/2015 | Shibata | H03M 1/1245 |
| | | | | 341/161 |
| 2016/0103423 | A1* | 4/2016 | Chang | H03M 1/124 |
| | | | | 341/118 |
| 2017/0085365 | A1* | 3/2017 | Ravi | H04L 7/042 |
| 2022/0083011 | A1* | 3/2022 | Gu | H03L 7/085 |
| 2022/0197646 | A1* | 6/2022 | Detwiler | G06F 9/3867 |
| 2022/0239222 | A1* | 7/2022 | Oshita | H02M 1/00 |
| 2022/0255553 | A1* | 8/2022 | Zhao | G04F 10/005 |
| 2022/0302918 | A1* | 9/2022 | Srivastava | G06F 1/08 |
| 2023/0396253 | A1* | 12/2023 | Bowles | H03K 19/1774 |

OTHER PUBLICATIONS

Chen, Qian et al., "A 6bit 1.2GS/s Symmetric Successive Approximation Energy-Efficient Time-to-Digital Converter in 40nm CMOS", IEEE Innovations for High performance Microelectronics, 2020, 5 pgs.

Choi, Sung-Won et al., "A Quasi-Digital Ultra-Fast Capacitor-less Low-Dropout Regulator Based on Comparator Control for x8 Current Spike of PCRAM Systems", 2018 Symposium on VLSI Circuits Digest of technical Papers, 2 pgs.

Chung, Hayun et al., "A 10-Bit 80-MS/s Decision-Select Successive Approximation TDC in 65-nm CMOS", IEEE Journal of Solid-State Circuits, vol. 47, No. 5, May 2012, 10 pgs.

Keane, John P. et al., "An 8GS/s Time-Interleaved SAR ADC with Unresolved Decision Detection Achieving −58dBFS Noise and 4GHz Bandwidth in 28nm CMOS", ISSCC 2017, Session 16, Gigahertz Data Converters, 16.5, 3 pgs.

Lee, Yong-Jin et al., "A 200-mA Digital Low Drop-Out Regulator With Coarse-Fine Dual Loop in Mobile Application Processor", IEEE Journal of Solid-State Circuits, vol. 52, No. 1, Jan. 2017, 13 pgs.

Li, Cheng et al., "Analysis of Reference Error in High-Speed SAR ADCs With Capacitive DAC", IEEE Transactions on Circuits and Systems-I: Regular Papers, vol. 66, No. 1, Jan. 2019, 12 pgs.

Mantyniemi, Antti et al., "A CMOS Time-to-Digital Converter (TDC) Based On a Cyclic Time Domain Successive Approximation Interpolation Method", IEEE Journal of Solid-State Circuits, vol. 44, No. 11, Nov. 2009, 12 pgs.

Martens, Ewout et al., "A 16nm 69dB SNDR 300MSps ADC with Capacitive Reference Stabilization", 2017 Symposium on VLSI Circuits Digest of Technical Papers, 2 pgs.

Zhang, Minglei et al., "A 4x Interleaved 10GS/s 8b Time-Domain ADC with 16x Interpolation-Based Inter-Stage Gain Achieving >37.5dB SNDR at 18GHz Input", ISSCC 2020, Session 16, Nyquist & VCO-Based ADCs, 16.2, 3 pgs.

* cited by examiner

TIME-TO-DIGITAL CONVERTER AND COMPARATOR-BASED REFERENCE VOLTAGE GENERATOR

BACKGROUND

High-speed (Giga-samples per second (GS/s)) data converters (e.g., analog-to-digital converters and digital-to-analog converters) are used for an increasing number of high-bandwidth communications applications, but boosting converter speed typically requires sacrificing energy efficiency. While massively parallel flash architectures provide the highest speed with minimal latency, the power consumption of an N-bit flash converter is proportional to $2^N$, resulting in poor efficiency as resolution increases. Successive approximation converters offer linear power scaling with bit resolution, but typically require an iterative feedback loop that increases conversion time by a factor of N. Pipelining can improve speed, but often requires analog amplification of the signal residue that may be difficult to implement in process technologies optimized for digital performance.

Switched-capacitor digital-to-analog-converters (DACs) are widely used as a core of low-power successive approximation (SAR) analog-to-digital converters (ADCs). At the DAC sampling rate (often multiple GHz), the capacitor array draws charge from a reference node providing a reference voltage dependent on a change in an input code. This drawn charge creates signal-dependent current pulses that are regulated to a desired ADC accuracy level before a SAR ADC's comparator makes a critical decision. Highspeed and high-resolution converters often require a large decoupling capacitance to attenuate these high-frequency spikes on the reference node and a low buffer output impedance to improve response time with this large capacitive load. This low output impedance requirement results in significant power consumption that may be comparable to the total ADC power. Regulation of this noise can be especially challenging in time-interleaved SAR ADC architectures where the reference is shared between multiple high-speed sub-ADCs.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
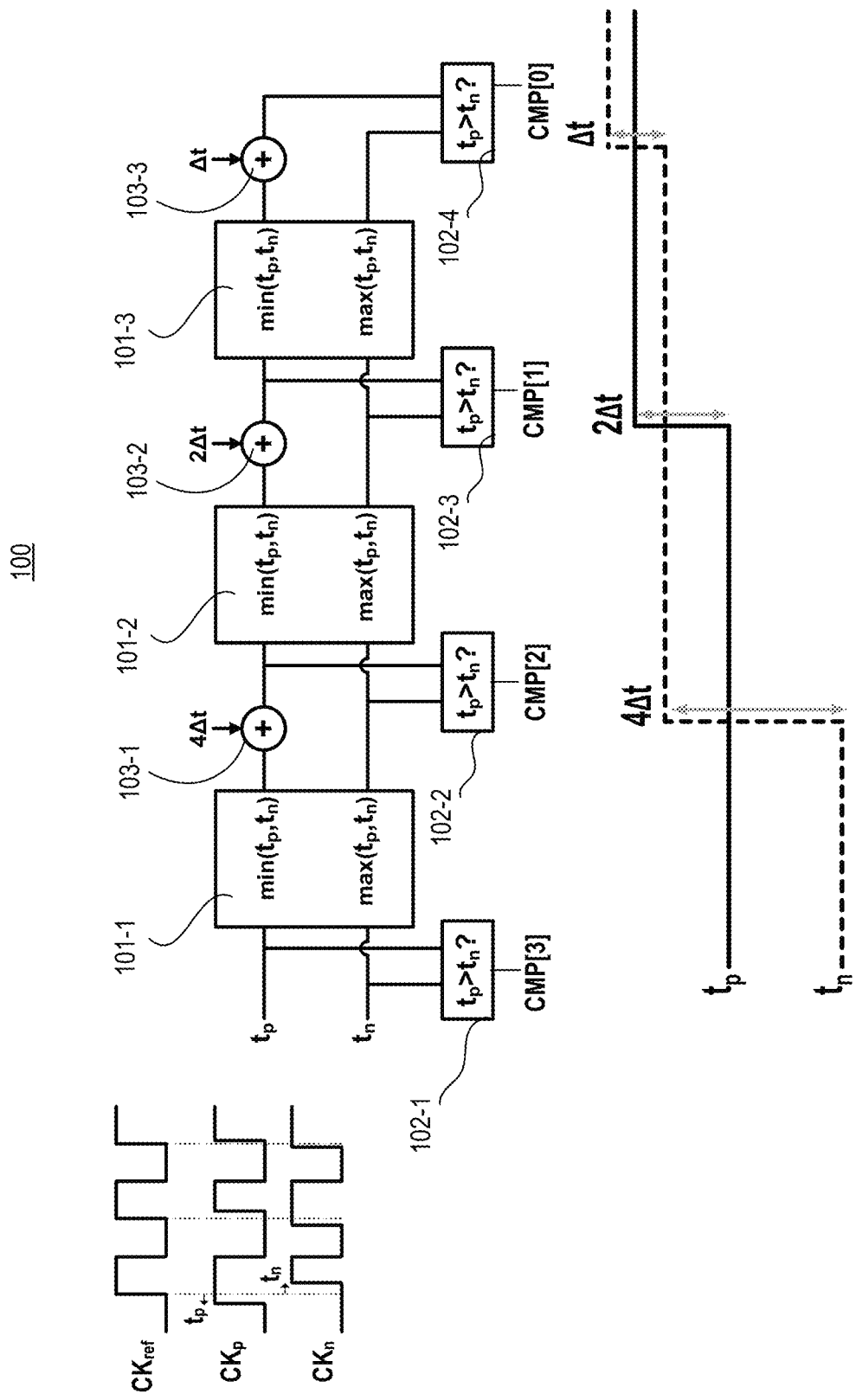
FIG. 1 illustrates a high-level architecture of a 4-bit time-to-digital converter (TDC), in accordance with some embodiments.

Some embodiments describe an apparatus that combines the energy efficiency of a successive approximation (SAR) design with the high speed of pipelined converters by leveraging the inherently pipelined nature of time-domain signaling. Some successive approximation time-to-digital converters (TDCs) use a feedback from a comparator at each stage, forcing conversion speed to be limited by the risk of comparator metastability. The TDC of some embodiments achieves high speed by removing the comparator decision from the signal path, instead using AND/OR gates (or their equivalent such as those derived from DeMorgan's theorem) to separate early and late edges. The TDC of some embodiments uses a pipelined SAR architecture to digitize a differential delay between two incoming clock edges with high speed and low power consumption. The design provides good energy efficiency and speed, as each pipelined stage uses digital AND/OR gates to identify the early or late edge of the incoming clocks. In various embodiments, a binary-weighted delay is added to the early edge at each stage. In some embodiments, the edge comparator to digitize the output operates in parallel with the main signal path to enable higher operating speed with reduced risk of incorrect decisions due to metastability.

There are many technical effects of the various embodiments. For example, the TDC apparatus provides a highly energy-efficient (e.g., simulated 6.3 fJ/conversion step with 4.7 effective number of bits (ENOB) at 2 GS/s) implementation of a high-speed TDC architecture that can be implemented with digital logic gates, making it amenable to process technology scaling. The speed and energy efficiency make it suitable for applications requiring fast but low-resolution converters such as high-speed wireline and/or wireless communication applications, digital phase locked loops (PLLs), sigma-delta quantizers, flash assisted SAR converters, or assist analog-to-digital converters (ADCs) that approximate the coarse input bits of a higher-resolution converter. Other technical effects of the TDC will be evident from the various figures and embodiments.

Some embodiments describe a modular digital reference voltage generator that can be used for a capacitive DAC. In some embodiments, the modular digital reference voltage generator comprises a decoupling capacitor, one or more clocked comparators, and power transistor(s). Because the capacitive DACs do not draw static current, the simplified digital low dropout (LDO) circuitry is used to provide fast reference voltage generation with minimal overhead, in accordance with some embodiments. In some embodiments, the LDO circuitry can be arrayed using time-interleaved synchronous clocks or staggered asynchronous clocks to provide finer timing resolution that improves regulation accuracy. While the embodiments for modular digital reference voltage generator are illustrated for use in a capacitive DAC, it can be used for any application that desires a reference voltage.

There are many technical effects of various embodiments of the reference generator. For example, the reference voltage generator is compact in size and well-suited for applications such as capacitive DACs in SAR ADCs. SAR ADCs are commonly used in high-speed data converters, which are building blocks in high-bandwidth wireline and wireless systems. The LDO circuitry of various embodiments uses a minimum number of components and is highly digital-intensive and scalable to different processing technology nodes. In some embodiments, while the design still uses a large decoupling capacitance, the digital architecture leads to a faster response time than continuous-time analog buffers, as it generates a high-speed switching current to balance the large current spikes generated from the DAC. This approach does not use extensive stability analysis and benefits from the improved speed of deeply scaled Complementary Metal Oxide Semiconductor (CMOS) technology nodes. Other technical effects of the reference generator will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates a high-level architecture 100 of a 4-bit time-to-digital converter (TDC), in accordance with some embodiments. Architecture 100 comprises pipeline stages 101-1, 101-2, and 101-3, each of which includes logic gates to identify the minimum and maximum of two quantities, $t_p$ and $t_n$, that represent the relative phase position of the rising edge of two clocks, CKp and CKn, relative to a reference clock CKref. FIG. 1 shows the theory of how architecture 100 operates on the delay quantities ($t_p$ and $t_n$). The delay quantities ($t_p$ and $t_n$) get split into a minimum (min) and maximum (max) value and delay is added where needed. Architecture 100 quantizes the time domain phase offset between $t_p$ and $t_n$. In some embodiments, each pipeline stage determines the minimum and maximum of input quantities $t_p$ and $t_n$ (e.g., $\min(t_p,t_n)$ and $\max(t_p,t_n)$, respectively) by identifying early and late edges of incoming signals, CKp and CKn. Architecture 100 further comprises comparator circuitries 102-1, 102-2, 102-3, and 102-4 coupled as shown. Each comparator circuity compares a corresponding set of inputs of a pipeline stage.

For example, comparator circuitry 102-1 compares the input delays $t_p$ and $t_n$ of pipeline stage 101-1, comparator circuitry 102-2 compares the input delays of pipeline stage 101-2, comparator circuitry 102-3 compares the input delays of pipeline stage 101-3, and comparator circuitry 102-4 compares the output delays of pipeline stage 101-3. After each pipeline stage, the smaller of the two outputs is delayed relative to the other output. The output of comparator 102-1 is CMP[3], the output of comparator 102-2 is CMP[2], the output of comparator 102-3 is CMP[1], and output of comparator 102-4 is CMP[0]. In some embodiments, the outputs of comparators 102 are differential outputs.

In various embodiments, one signal path output of each pipeline stage is delayed by delay elements. In some embodiments, a binary-weighted delay factor is added to the smaller of the two input quantities, $t_p$ and $t_n$, to execute a successive approximation algorithm. For example, the output of 101-1 is delayed by delay stage 103-1, the output of 101-2 is delayed by delay stage 103-2, the output of 101-3 is delayed by delay stage 103-3. The unit delay Δt can be programmable (e.g., by software, firmware, or hardware). Delay stage 103-1 has a delay of 4 delay units (e.g., 4 Δt). Delay stage 103-2 has a delay of 2 delay units (e.g., 2 Δt). Delay stage 103-3 has a delay of 1 delay unit (e.g., 4 Δt). In this example, the delay stages are binary weighted. In some embodiments, a high number of bits can be used to implement a TDC where the delay stages are thermometer weighted instead of binary weighted.

In various embodiments, comparators are used to evaluate which of the two input quantities, $t_p$ and $t_n$, is larger at each stage to enable binary signal decoding, but this comparison is done in parallel with the main signal path. The main signal path is the path that passes through the pipeline stage 101, which may be implemented with AND/OR logic gates (or its equivalent). The diagram below the TDC architecture shows the relative relationship between the inputs of the pipeline stages as the minimum of each of the signals is delayed by the delay stages. In various embodiments, each pipeline stage comprises digital AND/OR gates to identify the early or late edges of incoming clocks with relative edge positions $t_p$ and $t_n$. As such, the digital AND/OR gates form maximum and minimum detectors, respectively, for a rising edge signal (as shown in FIG. 1) or minimum and maximum detectors, respectively, for a falling edge signal. In various embodiments, the delay stages (e.g., stages 103-1 through 103-3) are implemented as delay lines. In various embodiments, comparators 102-1 through 102-4 operate in parallel to the main signal path which includes the digital AND/OR gates and the delay stages (e.g., stages 103-1 through 103-3). As such, higher operating speed with reduced risk of incorrect decisions due to metastability is achieved.

Figure 2:
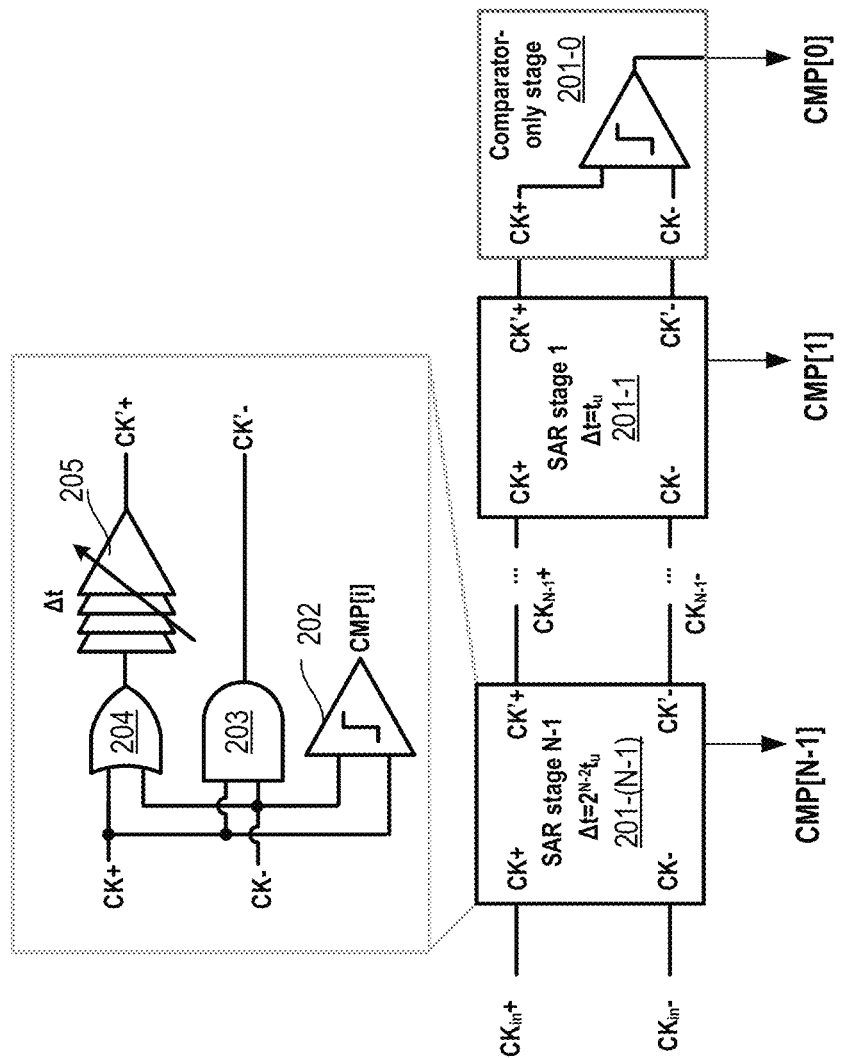
FIG. 2 illustrates an n-bit TDC with digital gates to identify early or late edges of incoming signals, in accordance with some embodiments.

FIG. 2 illustrates N-bit TDC 200 with digital gates to identify early or late edges of incoming signals, in accordance with some embodiments. N-bit TDC 200 includes N−1 SAR stages (e.g., SAR stage 1 through SAR stage N−1) labeled as 201-(N−1) through 201-1 and a single comparator stage as a last stage labeled as 201-0. Each SAR stage receives two clock inputs with information encoded in the difference between rising edge positions of these clocks (e.g., CKin+ and CKin−, where the time-domain input signal is the delay between the rising edge of CKin+ and CKin−), and generates a comparator output CMP. The N−1 SAR stages digitize a differential delay between two incoming clock edges with high speed and low power consumption. A SAR stage (e.g., 201-(N−1)) includes a comparator 202, AND gate 203, OR gate 204, and programmable delay stage 205 coupled as shown. The output of delay stage 205 is CK'+ while the output of the AND gate is CK'−. The design provides good energy efficiency and speed, as each pipelined stage uses digital AND/OR gates (203 and 204, respectively) to identify the early and late edge of the incoming clocks.

In some embodiments, the delay stage is a binary-weighted delay stage which is added to the early edge at each stage. For example, delay stage 205 is added at the output of OR gate 204. Unlike previous successive approximation TDCs, edge comparator 202 digitizes the output in parallel with the main signal path to enable higher operating speed with reduced risk of incorrect decisions due to metastability. The main signal path passes through AND/OR logic gates (or their equivalent). In some embodiments, comparator 202 is implemented as cross-coupled NAND or NOR latches. In some embodiments, the output of comparator 202 is coupled to a decoding logic in which each output bit of the TDC is inverted depending on a reading of a previous bit.

In some embodiments, the speed of the design may be enhanced by using a multiplexer or custom reconfigurable logic gates to swap between AND or OR outputs (of AND gate 203 and OR gate 204) on rising and falling signal edges. The implementation may also feature additional calibration mechanisms to reduce delay mismatch, or custom AND or OR gate device sizing to balance delays between the two gates, in accordance with some embodiments. In some embodiments, a measured output characteristic of the TDC has systematic Differential Non-linearity (DNL) characteristic if no calibration is used to compensate for the signal dependence of the AND or OR gate delays. In some embodiments, a lookup table (LUT) is used in the design to calibrate for this nonlinearity by mapping the measured TDC output code to a corrected value. The LUT may be determined by applying a known test signal such as a sine wave or linear ramp to the input of the TDC and associating the measured output code to the expected code. This mapping could be stored in digital memory such as static random-access memory (SRAM).

Figure 3:
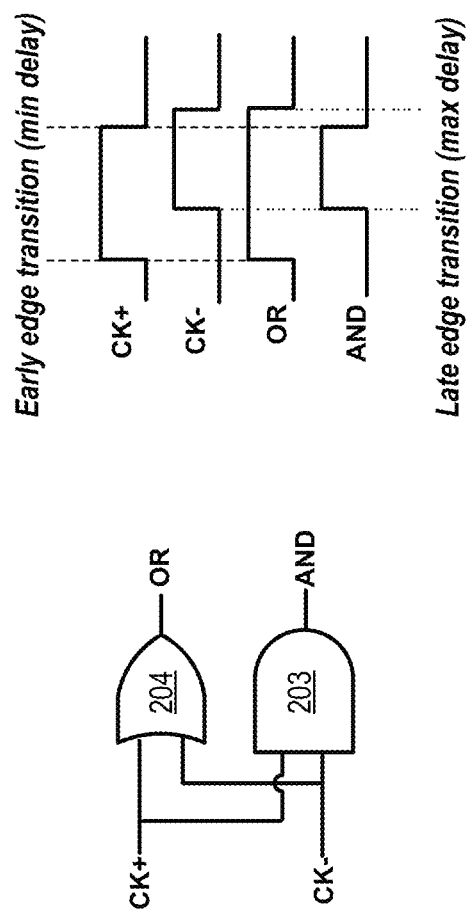
FIG. 3 illustrates digital gates comprising AND/OR gates and associated timing diagram.

FIG. 3 illustrates digital gates 300 comprising AND/OR gates and associated timing diagram. Digital gates 300 comprise AND gate 203 and OR gate 204 for use in a SAR pipeline stage of FIG. 2, in accordance with some embodiments. These digital gates 300 form maximum and minimum detectors of input qualities CK+ and CK−. The associated timing diagram shows that the logical AND operation will give the latest or earliest of two rising or falling edges, and the logical OR operation provides the opposite.

Figure 4:
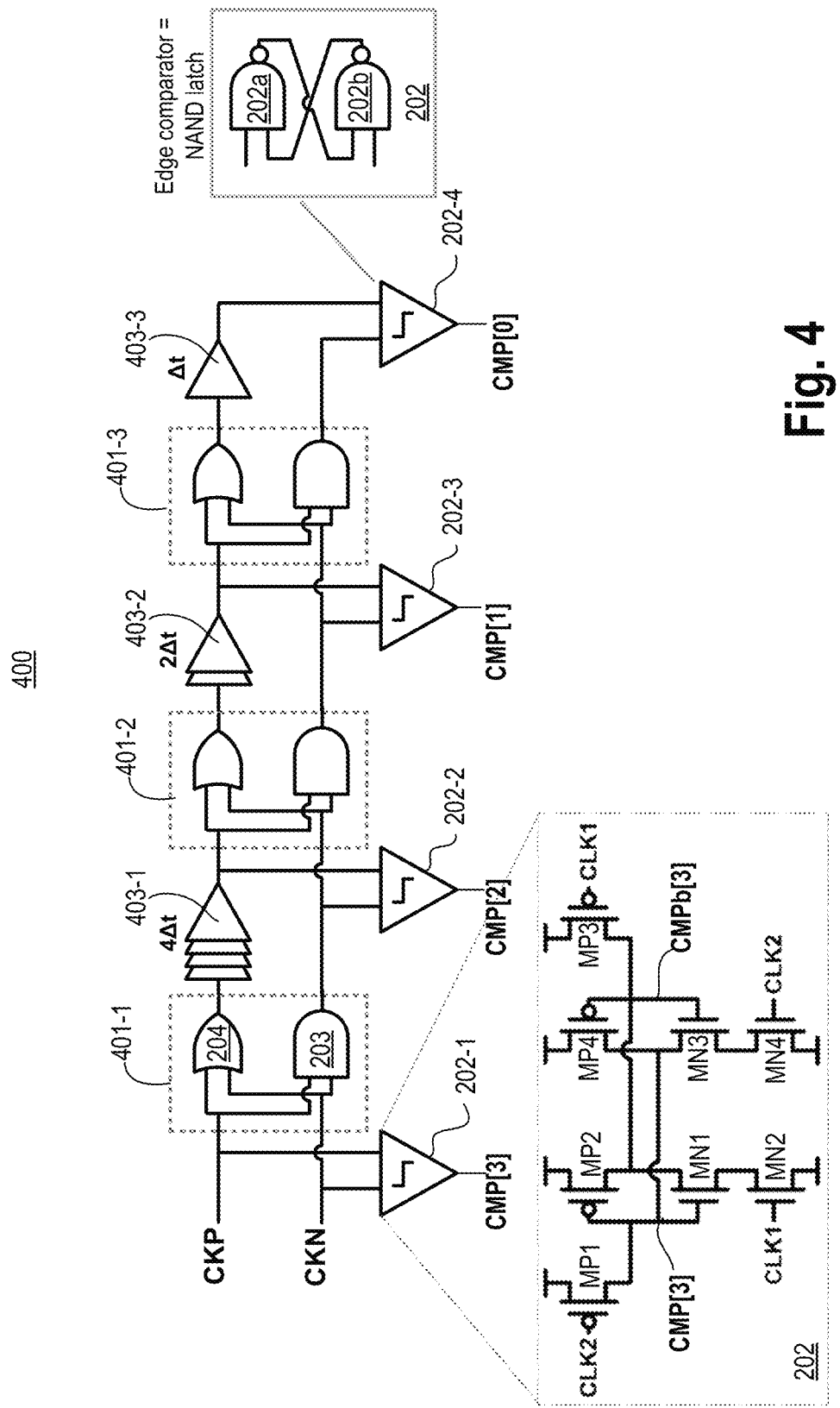
FIG. 4 illustrates a 4-bit time-domain rising edge TDC, in accordance with some embodiments.

FIG. 4 illustrates 4-bit time-domain TDC 400, in accordance with some embodiments. TDC 400 illustrates an implementation of the high-level architectures 100 and 200. In some embodiments, comparator 202 comprises cross-coupled NAND gates 202a and 202b. In some embodiments, the NAND gates can be replaced with NOR gates. One such embodiment comprises p-type transistors MP1, MP2, MP3, and MP4, and n-type transistors MN1, MN2, MN3, and MN4 coupled as shown. Transistors MP1/MN4 and MP3/MN2 receive clocks CLK2 and CLK1, respectively, where CLK1 is coupled to CKP and CLK2 is coupled to CKN. Here, node names and signal names are interchangeably used. For example, CKP may refer to node CKP or clock signal CKP depending on the context of the sentence. As discussed herein, each pipeline stage (e.g., stages 401-1, 401-2, 401-3) includes an AND gate 203 and an OR gate 204. The delay stages 403-1, 403-2, and 403-3 are binary weighted and can be implemented as delay lines (e.g., a chain of current starved inverters that provide delay programmability).

An output of the pipeline stage and an output of the delay stage are coupled to input of a comparator that generates the comparison output CMP. The first comparator receives both the input clocks, CKP and CKN. In this example, comparator 202-1 receives CKP and CKN at its inputs and generates CMP[3], comparator 202-2 receives output of delay stage 403-1 and output of AND gate 203 of pipeline stage 401-1 and generates CMP[2], comparator 202-3 receives output of delay stage 403-2 and output of AND gate 203 of pipeline stage 401-2 and generates CMP[1], and comparator 202-4 receives output of delay stage 403-3 and output of AND gate 203 of pipeline stage 401-3 and generates CMP[0]. While the embodiments illustrate a 4-bit TDC, it can be extended to any TDC resolution (e.g., n-bit TDC where 'n' is a number).

Figure 5:
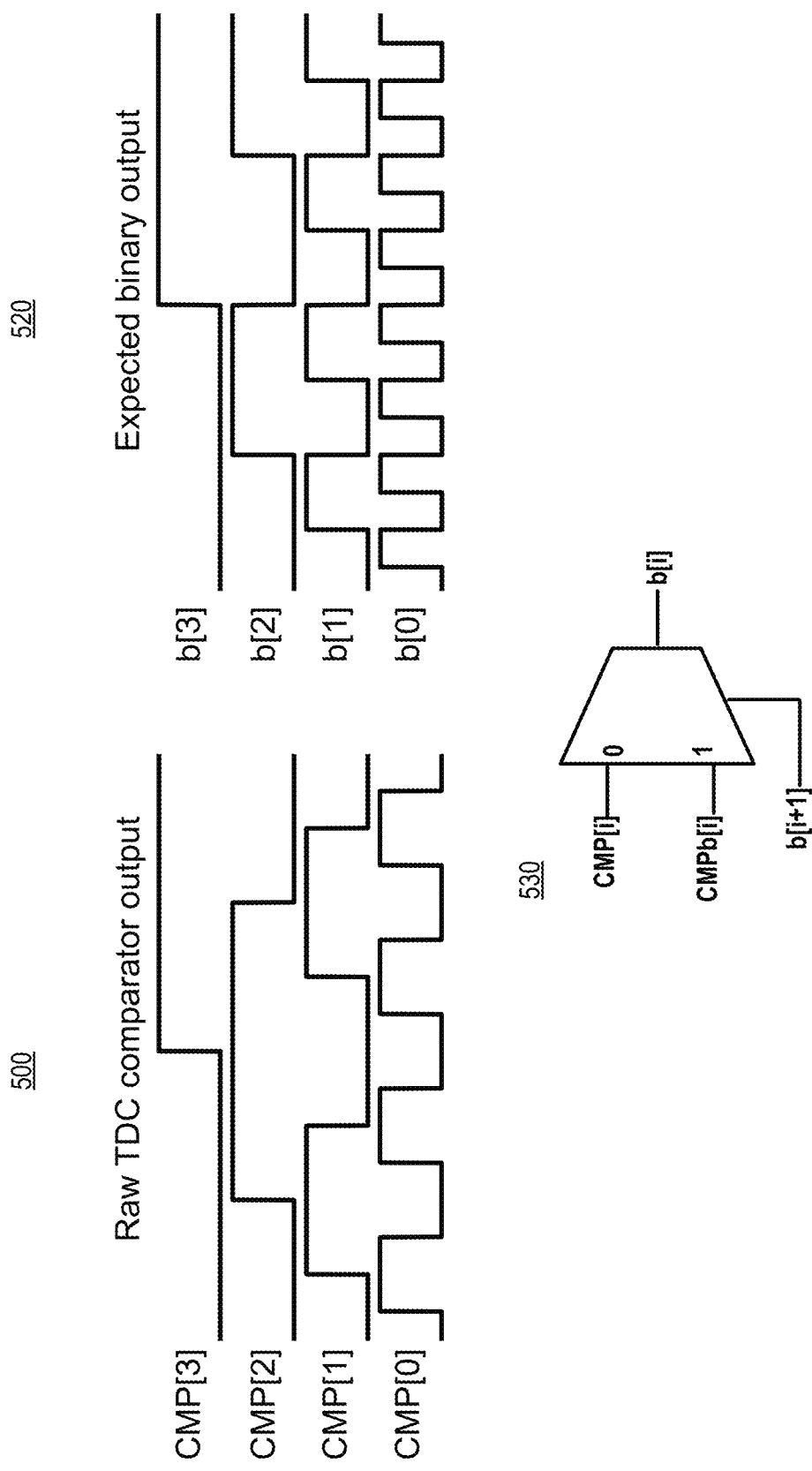
FIG. 5 illustrates a set of timing diagrams including a timing diagram of comparator outputs of the 4-bit TDC, and a timing diagram of an expected binary output of the TDC, and an output bit decoding logic, in accordance with some embodiments.

FIG. 5 illustrates diagram 500 including a diagram of comparator outputs of the 4-bit TDC with a linear ramp input, and diagram 520 of an expected binary output of the TDC with a linear ramp input, and an output bit decoding logic 530, in accordance with some embodiments. In some embodiments, decoding logic 530 comprises a multiplexer to generate a binary code from the comparator result. The inputs to the multiplexer include a comparator output and its inverse. For example, input node '1' which propagates to the multiplexer output when the select bit is '1' receives CMP[i] (where 'i' is a number) while input node '0' receives the inverse of CMP[i], i.e., CMP[i]. The multiplexer selects one of CMP[i] or CMPb[i] depending on a previous TDC output bit b[i+1], where b[i] is the current TDC output bit. As such, in some embodiments, decoding logic 530 optionally inverts each bit depending on the value of the previous bit. In some embodiments, most significant bit (MSB) decoding may not be used or desired. In some embodiments, decoding logic 530 helps to correct for incorrect comparator decisions. For instance, if the MSB (CMP[3] in timing diagram 520) is sampled at the bit transition edge, the output may be either 1 or 0. However, the next bit (CMP[2]) will be 1 with a high degree of certainty because the CMP[2] comparator input swing will be large. Similarly, the remaining bits will have a maximal input swing and the probability of an incorrect decision will be low. With decoding logic 530, the 4b TDC output (b[0:3]) will be either 1000 or 0111 if the input is half of the full-scale range—error in the MSB decision can be corrected.

The implementation shown in FIG. 4 operates on the rising edges of the input clocks. However, the data rate of the TDC can be doubled using a multiplexer or custom reconfigurable gate to swap AND/OR outputs between the rising and falling edges of the input signal, as shown in FIG. 6.

Figure 6:
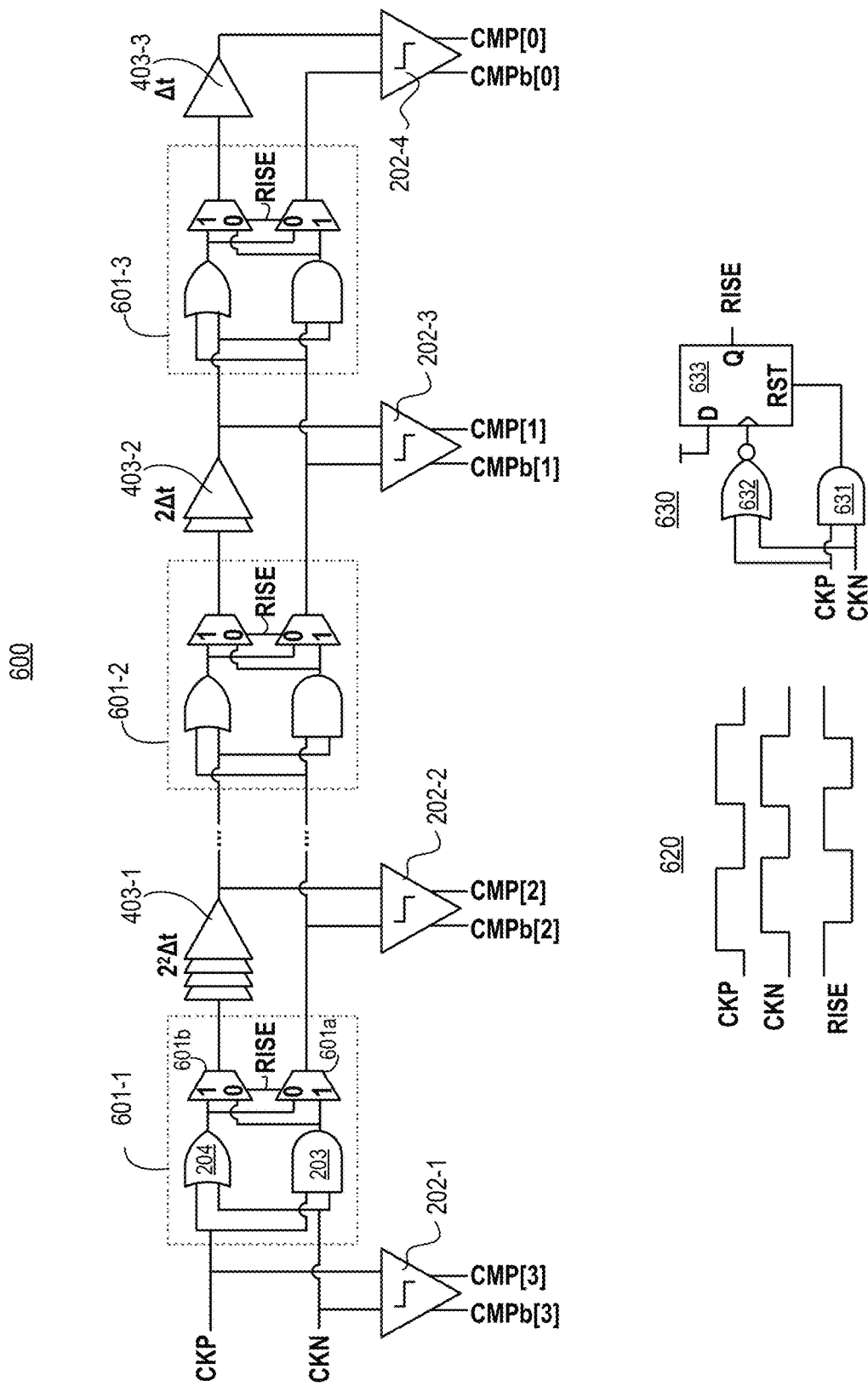
FIG. 6 illustrates an n-bit rising and falling edge TDC architecture that re-uses core signal path hardware, a circuit to generate control for multiplexers, and an associated timing diagram, in accordance with some embodiments.

FIG. 6 illustrates a 4-bit TDC architecture 600 that re-uses core signal path hardware, a circuit to generate control for multiplexers, and an associated timing diagram, in accordance with some embodiments. Pipeline stages 401-1 through 401-3 of FIG. 4 are replaced with pipeline stages 601-1 through 601-3. Each pipeline stage includes an AND gate 203, an OR gate 204, a first multiplexer 601a and a second multiplexer 601b. Each multiplexer receives outputs of the OR and AND gates and is controlled by a select signal RISE. One purpose of first multiplexer 601a and second multiplexer 601b is to double the data rate of the TDC. The data rate of the TDC is doubled by swapping AND/OR outputs between the rising and falling edges of the input signal. This allows information to be encoded on both the rising and falling edges of CKP/CKN. This architecture adjustment saves area by reusing the core signal path hardware.

The control signal RISE could be provided externally or generated from the early/late edge output at each pipeline stage, in accordance with some embodiments. Timing diagram 620 provides a relative relationship of the control RISE compared to input clocks CKP and CKN. The select signal RISE that controls the swapping of the outputs of AND and OR gates is generated by circuitry 630. Circuitry 630 comprises AND gate 631, NOR gate 632, and D-flip-flop 633 coupled as shown. The inputs of AND gate 631 and NOR gate 632 receive input clock CKP and CKN. The output of AND gate 631 is used to reset D-flip-flop 633 to ground. The output of NOR gate 632 is used to clock or sample a predetermined input D (here tied to Vdd or supply node) of D-flip-flop 633 to generate the output RISE. In some embodiments, another set of comparators are added to operate on the falling edge input (e.g., NOR latch instead of NAND latch), and device sizing are optimized to match the rising and falling edge delays. This error could be compensated with gain correction at the input or in digital post-processing, in accordance with some embodiments. While the embodiments illustrate a 4-bit TDC, it can be extended to any TDC resolution (e.g., n-bit TDC where 'n' is a number). For an n-bit TDC, the first delay stage (e.g., 601-1) is coupled to a delay stage having $2^{(N-1)}$ delay elements, where each delay element has a delay of $\Delta t$.

In some embodiments, AND gate 203 and OR gate 204 are implemented as a NAND gate and a NOR gate, respectively, followed by respective inverters. Systematic nonlinearity in the TDC's transfer characteristic can be caused by the signal-dependent edge rate of the NAND/NOR gate delay. When the two input edges are staggered, the NOR pull-down network is a single set of stacked devices. When the two input edges arrive simultaneously, the NOR delay is reduced because two parallel stacks of output devices of a NOR gate turn on. Without correction, this DNL limits the TDC LSB (e.g., to approx., 10 ps). In some embodiments, look-up tables may be used to compensate for this systematic effect.

Figure 7:
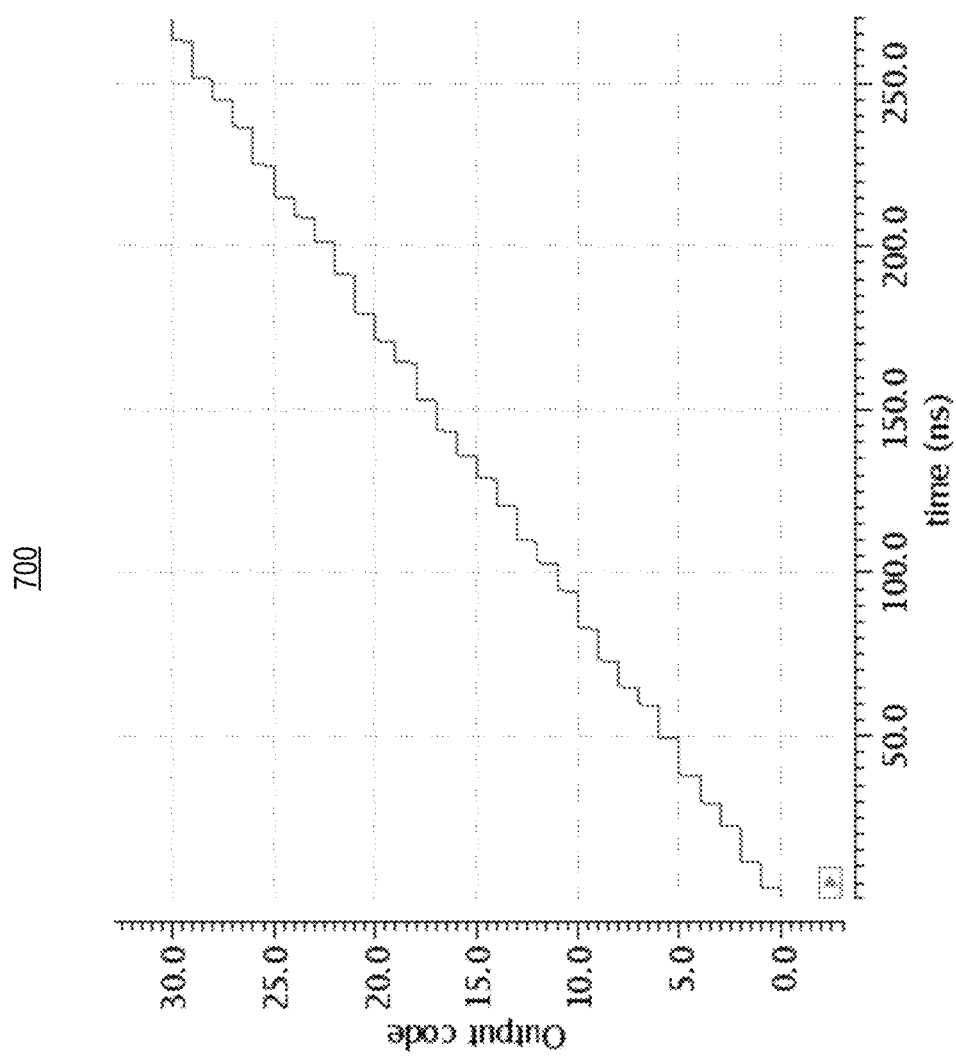
FIG. 7 illustrates a plot showing output characteristic of the TDC with linear ramp input, in accordance with some embodiments.

FIG. 7 illustrates plot 700 showing output characteristic of the TDC with linear ramp input, in accordance with some embodiments. In this example, the delay vs. output code transfer characteristic of the design are shown for a TDC operating at 2 GS/s.

In some embodiments, the speed and energy efficiency of the TDC make it suitable for applications requiring fast but low-resolution converters such as high-speed wireline and/or wireless communication applications, digital phase locked loops (PLLs), sigma-delta quantizers, flash assisted SAR converters, or assist analog-to-digital converters (ADCs) that approximate the coarse input bits of a higher-resolution converter. In an PLL, a phase frequency detector or a phase detector that compares a reference clock with a feedback clock can be replaced with the TDC of various embodiments. The output of the TDC is then used to control an oscillating frequency of an oscillator of the PLL.

Figure 8:
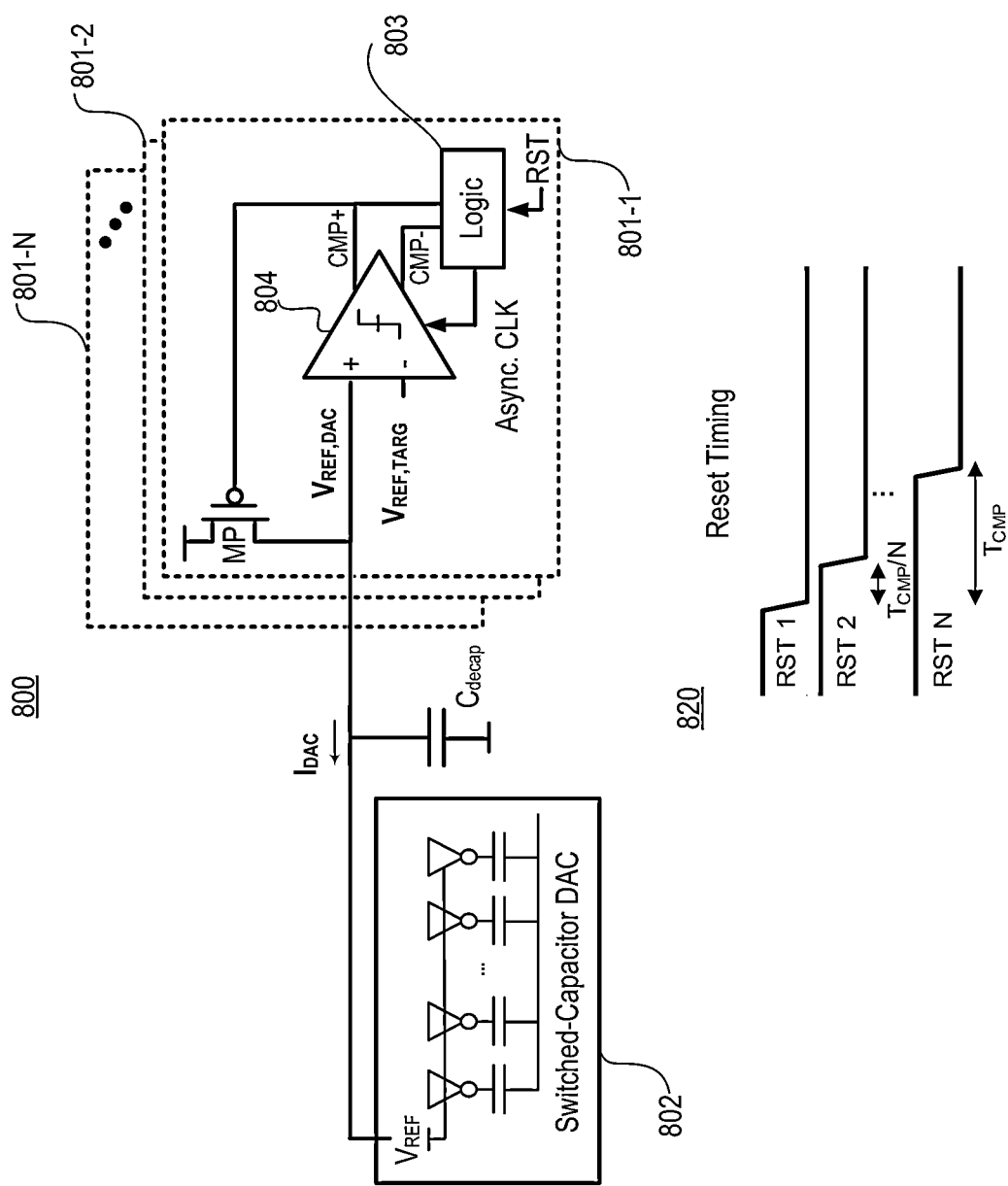
FIG. 8 illustrates a reference generator comprising a comparator-based low dropout circuitry using an asynchronous clock, in accordance with some embodiments.

FIG. 8 illustrates reference generator 800 comprising a comparator-based low dropout circuity using an asynchronous clock, in accordance with some embodiments. In some embodiments, the reference generator comprises a plurality of low dropout (LDO) circuitries 801-1 through 801-N, where N is a number. The LDO circuitries are coupled in parallel and provide a reference voltage $V_{REF,DAC}$ to a target circuitry such as a switched-capacitor DAC 802. DAC 802 is illustrated as inverting drivers coupled to capacitors. This is just a symbolic view. A person skilled in the art would appreciate that switched capacitor DACs include controllable switches coupled to capacitors, where the switches couple an analog input (which is to be converted to a digital representation) to either the reference voltage or ground depending on a control signal (e.g., a logic feedback signal). In a switched-capacitor DAC, the input voltage is often sampled onto the top plate (the node shared between all unit capacitors) with a switch, but the actual DAC voltage is controlled based on how the bottom plate voltage of each unit capacitor is set. This bottom plate voltage is often switched to either ground or Vref, and the reference voltage generator provides this Vref signal. The output charge developed on the terminals of capacitors is then received by an amplifier or a quantizer to generate the final digital representation of the analog input.

In various embodiments, the reference voltage $V_{REF,DAC}$ is an average of the reference voltage from each of the LDO circuitries 801-1 through 801-N. In some embodiments, the $V_{REF,DAC}$ node is coupled to a decoupling capacitor $C_{decap}$. In some embodiments, the coupling capacitor $C_{decap}$ is implemented as one or more of: a discrete capacitor, a ferroelectric capacitor, a metal-insulator-metal (MIM) capacitor, or a transistor-based capacitor. In some LDO circuitry 801 comprises a clock generation logic 803, comparator or amplifier 804, and power device MP. Here, description of a general reference to a circuitry is applicable to various instances of that circuitry. For example, description about LDO circuitry 801 is applicable to instances of LDO circuitry 801-1 through 801-N.

In some embodiments, LDO circuitry 801 can be arrayed, with staggered comparator clocks (e.g., RST 1, RST 2, . . . RST N) to provide finer time resolution as shown by timing diagram 820. In some embodiments, the comparator reset pulses are staggered to ensure the asynchronous comparator clocks are phase shifted roughly 1/N times the average comparator decision time ($T_{CMP}$). The delay between reset signals can be increased or reduced by integer multiples of $T_{CMP}$ without affecting the LDO performance. The phase shifted reset pulses could be generated with a digitally tunable delay line, or by resampling an initial reset signal onto a register clocked with phase interpolated versions of previously generated asynchronous clocks. Random (e.g.

due to device mismatch) or applied variation in the comparator decision feedback time will lead to different asynchronous clock frequencies, which will also help ensure comparator decisions are staggered. So, in some embodiments, fine control of the reset delay spacing is may not be critical if N is large.

In some embodiments, comparators 804 can be clocked asynchronously to maximize operating frequency. During each clock cycle, both differential outputs of comparator 804 are reset high, and CMP+ falls at the rising edge of the clock if $V_{REF,DAC} < V_{REF,TARG}$, where $V_{REF,TARG}$ is an ideal reference (CMP− falls otherwise). When the CMP+ output of comparator 804 goes low, a fixed amount of charge is injected back onto the decoupling capacitor via the power device MP. If $V_{REF,DAC} > V_{REF,TARG}$ because the DAC output voltage change is small, no current is injected to the reference node by power device MP. Asynchronous clocking can be implemented by logic 803 (e.g., an XOR gate or NAND gate if the differential comparator outputs are reset high) for a differential clocked comparator such as a strong-arm latch (SAL). In various embodiments, the p-type power device MP is sized to ensure that the charge injected to the output reference node is higher than an average charge drawn by DAC 802.

While the LDO circuitry 801 is illustrated with a p-type power device, the p-type power device can be replaced with an n-type power device, or a combination of p-type and n-type power device. In some embodiments, the p-type devices in each LDO circuitry 801 is of identical size. In some embodiments, the p-type devices in the LDO circuitry 801 are binary weighted. In some embodiments, the p-type devices in different LDO circuitries 801 are thermometer weighted.

Figure 9:
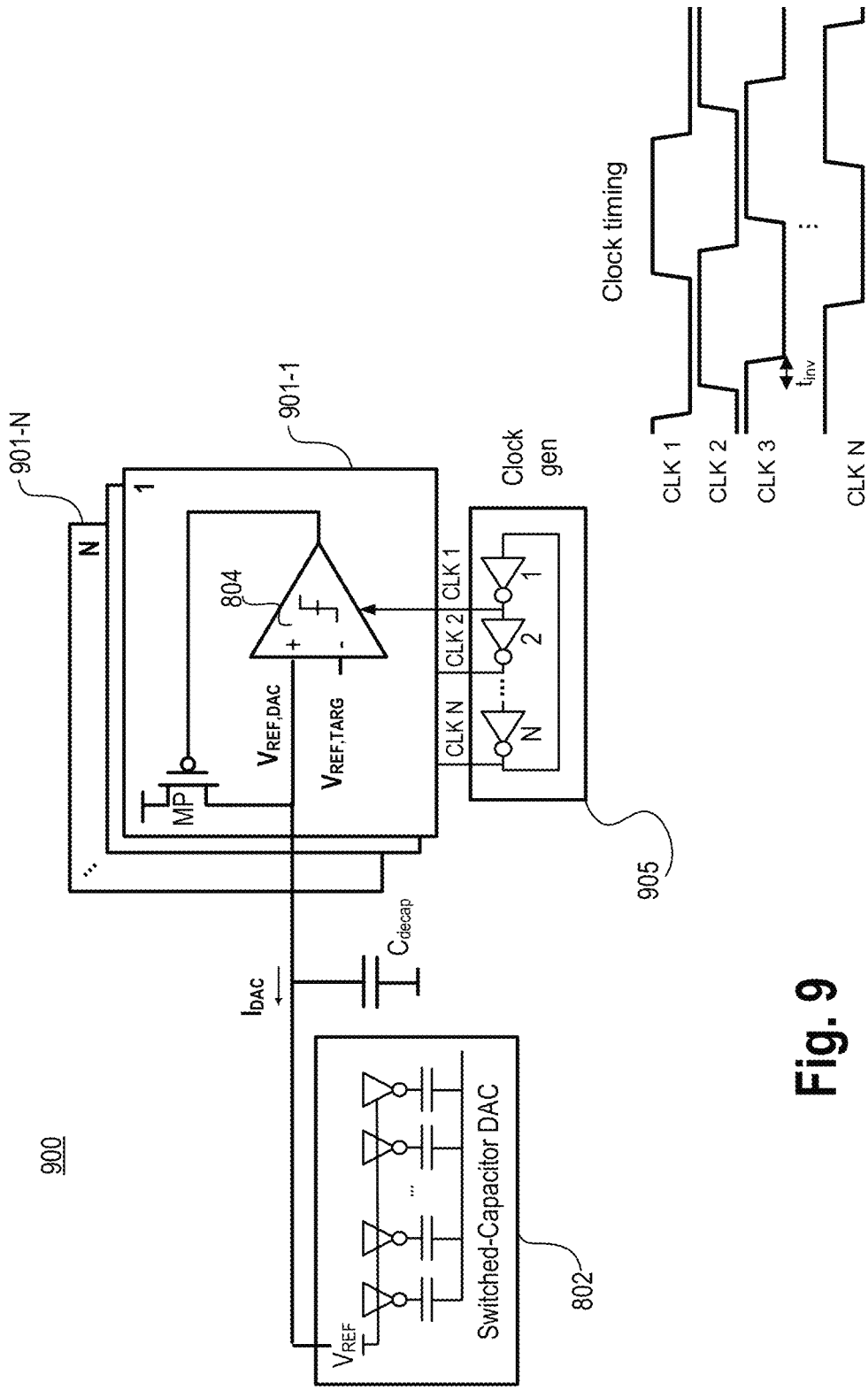
FIG. 9 illustrates a reference generator architecture comprising comparator-based low dropout circuitry using synchronous clock for odd-valued N number of reference generators, in accordance with some embodiments.

FIG. 9 illustrates reference generator architecture 900 comprising comparator-based low dropout circuity using synchronous clock for odd-valued N number of reference generators, in accordance with some embodiments. Architecture 900 is similar to architecture 800 but for a different mechanism to clock comparator 804. In some embodiments, comparator 804 of each LDO circuitry 901-1 through 901-N can be clocked synchronously to guarantee staggered decision times and reduce ripple, particularly in scenarios with lower decoupling capacitance. Because the performance of LDO circuitry 901 is insensitive to the jitter and mismatch of the comparator clock, ring oscillator 905 can be used for multiphase clock generation. Ring oscillator comprises inverters 1 through N coupled in a ring formation. The output of each inverter (or its equivalent logic gate) is a clock which is used to clock a comparator of an LDO circuitry. Finer time resolution may be obtained by applying phase interpolation to the ring oscillator outputs. In some embodiments, LDO circuitry 901 can be arrayed, with staggered comparator clocks (e.g., CLK 1, CLK 2, . . . CLK N) to provide finer time resolution. For example, clock CLK 1 is used to sample comparator 804 of LDO circuitry 901-1, clock CLK 2 is used to sample comparator 804 of LDO circuitry 901-2, and so on.

While the LDO circuitry 901 is illustrated with a p-type power device, the p-type power device can be replaced with an n-type power device, or a combination of p-type and n-type power device. In some embodiments, the p-type devices in each LDO circuitry 901 is of identical size. In some embodiments, the p-type devices in the LDO circuitry 901 are binary weighted. In some embodiments, the p-type devices in different LDO circuitries 901 are thermometer weighted.

Figure 10:
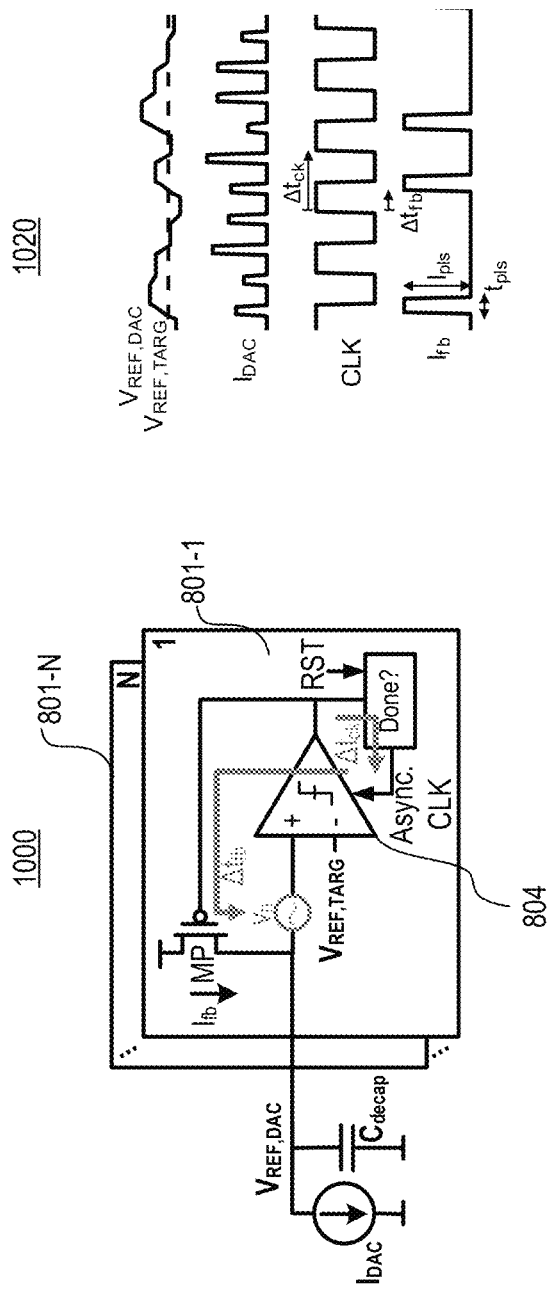
FIG. 10 illustrates a model of parameters in a comparator-based design of FIG. 8, and associated timing diagram, in accordance with some embodiments.

FIG. 10 illustrates model 1000 of parameters in a comparator-based design of FIG. 8, and associated timing diagram 1020, in accordance with some embodiments. The power device MP injects a fixed current step ($I_{pls}$ high and $t_{pls}$ long) to the load ($I_{DAC}$) after a fixed decision plus feedback delay $\Delta t_{fb}$, and a new comparator decision by comparator 804 is initiated after a delay $\Delta t_{ck}$. In the asynchronous case, $\Delta t_{ck}$ is signal-dependent and each sub-comparator is reset at spaced time intervals to maximize the effective speed, while in the synchronous case $\Delta t_{ck}$ is fixed. In some embodiments, $\Delta t_{ck}$ is a programmable amount of time. Each comparator 804 has a normally distributed input-referred noise $v_n$, but comparator offset is assumed to be calibrated.

Figure 11:
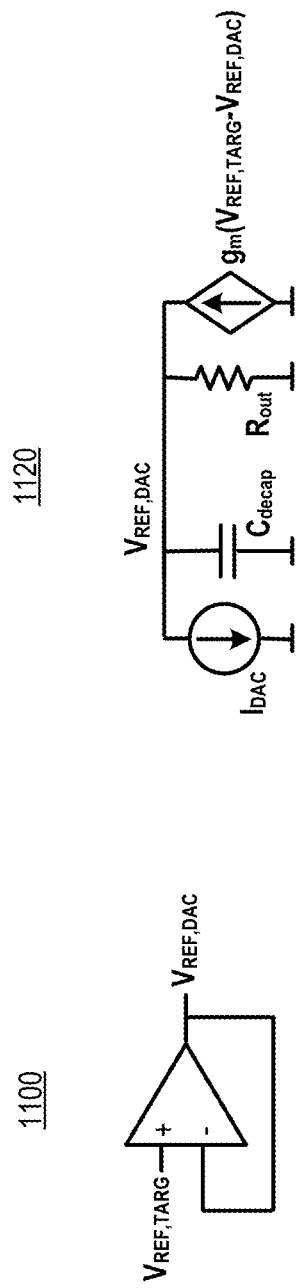
FIG. 11 illustrates an analog reference buffer and corresponding small signal model.

FIG. 11 illustrates analog reference buffer 1100 and corresponding small signal model 1120. Model 1120 assumes a fixed transconductance $g_m$ and output resistance $R_{out}$ from buffer 1100, with no additional bandwidth limitation. Thermal noise is not considered in this example.

Figure 12:
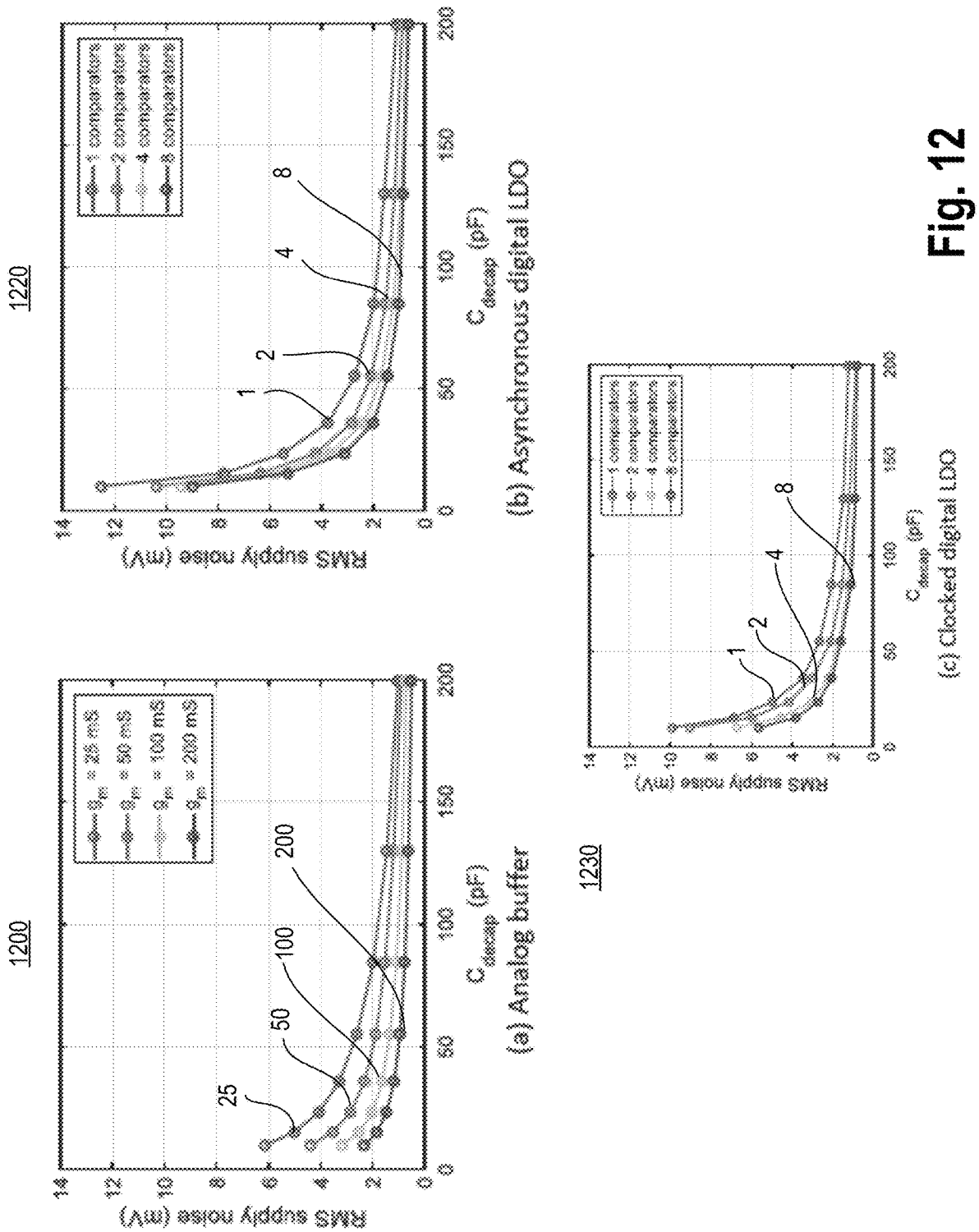
FIG. 12 illustrates a set of plots showing root mean square (RMS) reference voltage noise of the analog buffer of FIG. 11, RMS voltage noise of asynchronous digital LDO based reference generator of FIG. 8, and RMS voltage noise of synchronous digital LDO based reference generator of FIG. 9, in accordance with some embodiments.

FIG. 12 illustrates a set of plots including a first plot 1200 showing simulated root mean square (RMS) reference voltage noise of the analog buffer of FIG. 11, a second plot 1220 showing RMS voltage noise of asynchronous digital LDO based reference generator of FIG. 8, and a third plot 1230 showing RMS voltage noise of synchronous digital LDO based reference generator of FIG. 9, in accordance with some embodiments. The simulated RMS ripple (load-dependent noise) as a function of decoupling capacitance and LDO design parameters is shown herein. The current load is modeled as a sequence of $t_{ld}$=30 ps wide pulses at 10 GHz with current heights uniformly distributed from 0 to $I_{ld,pk}$=5 mA. The DC gain of the analog buffer is assumed to be 100 V/V. The comparator's input referred noise is 3 mVrms, and the per-element power device current $I_{pls}$ is proportional to $$\frac{I_{ld,pk}}{N_{cmps}}\left(\frac{t_{ld}}{t_{pls}}\right)(f_{DAC}\Delta t_{ck}).$$

This maintains a current that can balance the load requirements as the number of comparators ($N_{cmps}$) increases. The comparator feedback time $\Delta t_{fb}$ is 70 ps, $\Delta t_{ck}$ is 200 ps, and $t_{pls}$ is 30 ps. The input voltage vs. $\Delta t_{ck}$ characteristic in the asynchronous case is obtained via a simulation of a strong-arm latched comparator.

For small values of $C_{decap}$, the analog approach achieves lower RMS ripple if $g_m$ is sufficiently large. However, when $C_{decap}$ is increased to attain lower ripple, the digital LDO can provide comparable performance without requiring the high static power needed to generate a large $g_m$. Of the comparator LDOs, the clocked structure reduces noise when $C_{decap}$ is low, but both provide similar performance with large $C_{decap}$. While implementing a $g_m$ of 100 mS may require on the order of 10 mA current from a single transistor using an overdrive voltage of approximately 200 mV, the comparator logic at 5 GHz may draw approximately 0.25 mW, or approximately 2 mW total for eight comparators using the parameters described. This power may reduce with technology scaling. In addition to requiring substantially lower overhead power, the digital reference generator of various embodiments does not have the instability concerns associated with more complex multi-stage analog LDOs.

In some embodiments, the decoupling capacitance directly determines the reference noise by defining the voltage step for a fixed amount of charge drawn from the $$DAC\left(\Delta V = \frac{Q}{C}\right).$$

While the capacitance may not limit the response time of the LDO circuitry in the comparator-based architecture if the PMOS power device is sized properly, $C_{decap}$ can be minimized to reduce DAC area. Table 1 summarizes the simulated 4-tone signal-to-noise-and-distortion (SNDR) at the DAC voltage output as a function of $C_{decap}$.

TABLE 1

| $C_{decap}$ | DAC voltage SNDR |
|---|---|
| 25 pF | 61.4 dB |
| 50 pF | 63.8 dB |
| 100 pF | 65.2 dB |

In one example, a comparative analog LDO applied to the same capacitive DAC demonstrated a peak DAC voltage SNDR of 58.2 dB using 100 pF $C_{decap}$. With an ideal voltage source reference, the simulated peak SNDR is 65.5 dB. The architecture of various embodiments can therefore provide negligible performance degradation and a simple, compact implementation using 100 pF $C_{decap}$. The digital LDO circuitry for reference generation can be used to drive multiple SAR sub-ADCs sharing the same reference voltage in a time-interleaved converter.

Figure 13:
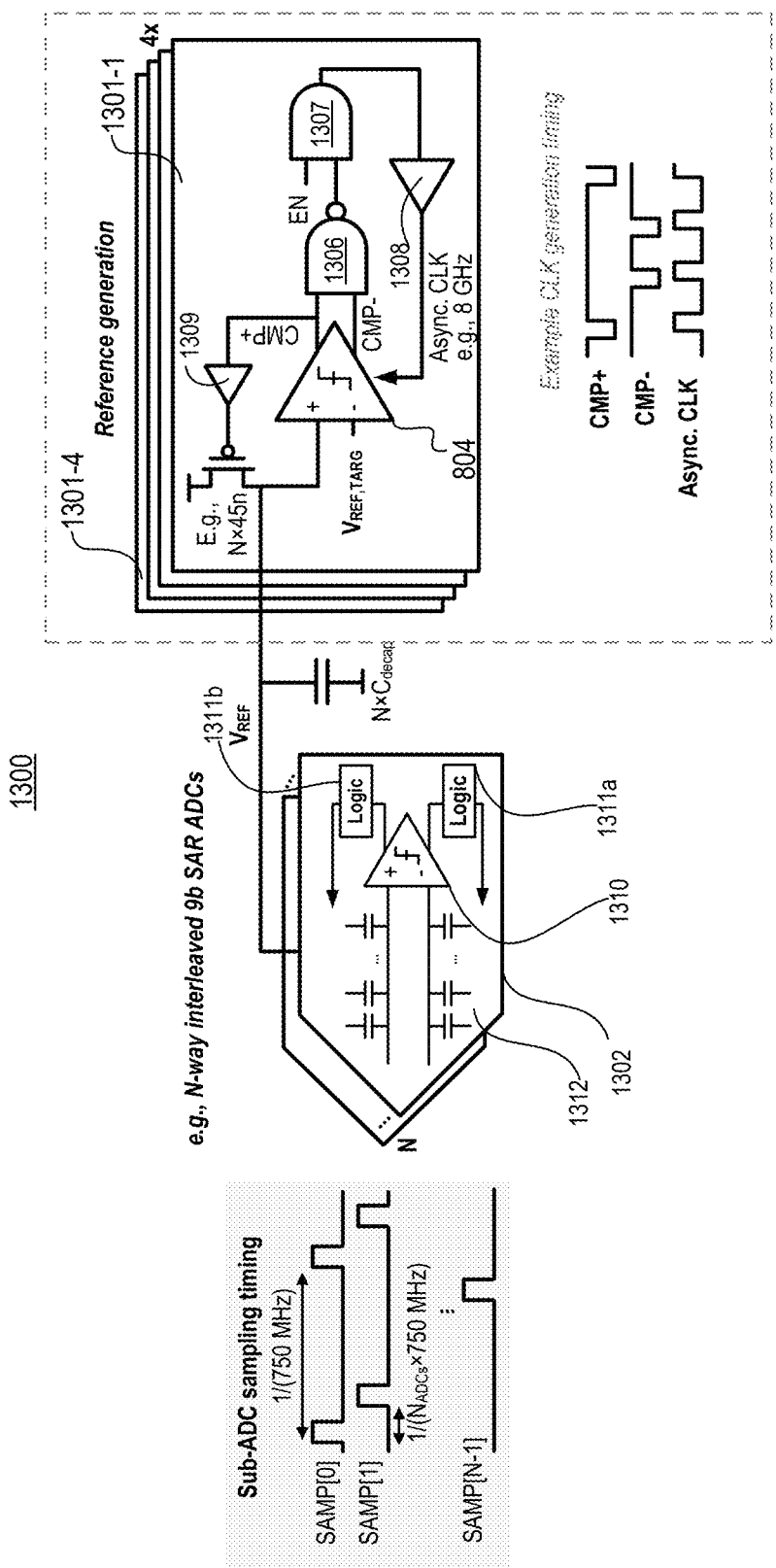
FIG. 13 illustrates a circuitry for characterization of an analog-to-digital converter having the comparator-based low dropout circuitry using an asynchronous clock, in accordance with some embodiments.

FIG. 13 illustrates circuitry 1300 for characterization of a time-interleaved analog-to-digital converter (ADC) having the comparator-based low dropout circuity using an asynchronous clock, in accordance with some embodiments. Circuitry 1300 comprises LDO based reference generation circuitries 1301-1 through 1301-4. In this example, four copies of LDO based reference generation circuitries are shown. However, any number of LDO based reference generation circuitries can be coupled in parallel to provide a single voltage reference Vref. Circuitry 1300 is similar to circuitry 800 but with additional gates in logic 803 for LDO circuitry 1301 that can be used to enable to disable the asynchronous clock to comparator 804. These additional gates include NAND gate 1306, AND gate 1307, and buffer 1308 coupled as shown. In some embodiments, output of comparator 804 drives a number of copies of p-type power device via buffer 1309. The p-type power devices can be coupled in parallel. The reference voltage Vref is provided to ADC 1302 with capacitive DAC 1312. Capacitive DAC 1312 is similar to capacitive DAC 802, and additional logic is shown to illustrate its possible use in successive approximation ADC 1302. These additional logics include comparator 1310 and logic 1311a and 1311b to control switches of the capacitive DAC. Logic 1311a and 1311b generate feedback signals to control the switches of capacitive DAC 1312 after an analog voltage is sampled onto the DAC via sampling signals SAMP[0] through SAMP[N−1], which are generated externally. Here, SAMP[i] signals show the relative timing phases of the N sub-ADCs.

Sharing the reference Vref allows a larger total decoupling capacitance ($C_{decap}$) to be used when $C_{decap}$ per sub-ADC is fixed to conserve area. Because the response speed of the digital LDO 1301 is independent of $C_{decap}$, this reduces ripple without using additional power to improve bandwidth. Jitter from the asynchronous LDO architecture of various embodiments can help spread LDO switching tones across frequency, though greater than 60 dB SFDR is still achievable using the synchronous LDO.

Circuitry 1300 characterizes the impact of the asynchronous digital LDO on interleaved 9-bit SAR ADCs operating at, for example, 750 MS/s. In this example, each ADC has a binary-weighted DAC capacitance of 64 fF on each side. The sub-ADC interleaving factor (N) is varied from 1 to 8, with evenly spaced sampling clocks (SAMP[0] through SAMP[N−1]). LDO circuitry 1301 is implemented with 4 asynchronously clocked comparators 804 operating at approximately 8 GHz staggered by 30 ps.

Figure 14:
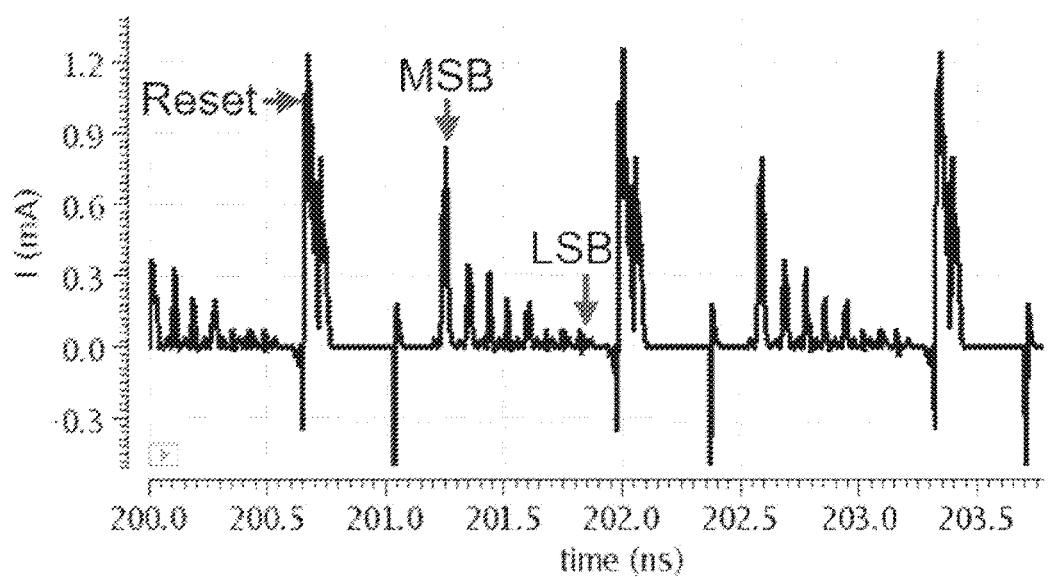
FIG. 14 illustrates a plot showing a simulation of a single sub-ADC load current, in accordance with some embodiments.
Figure 14:
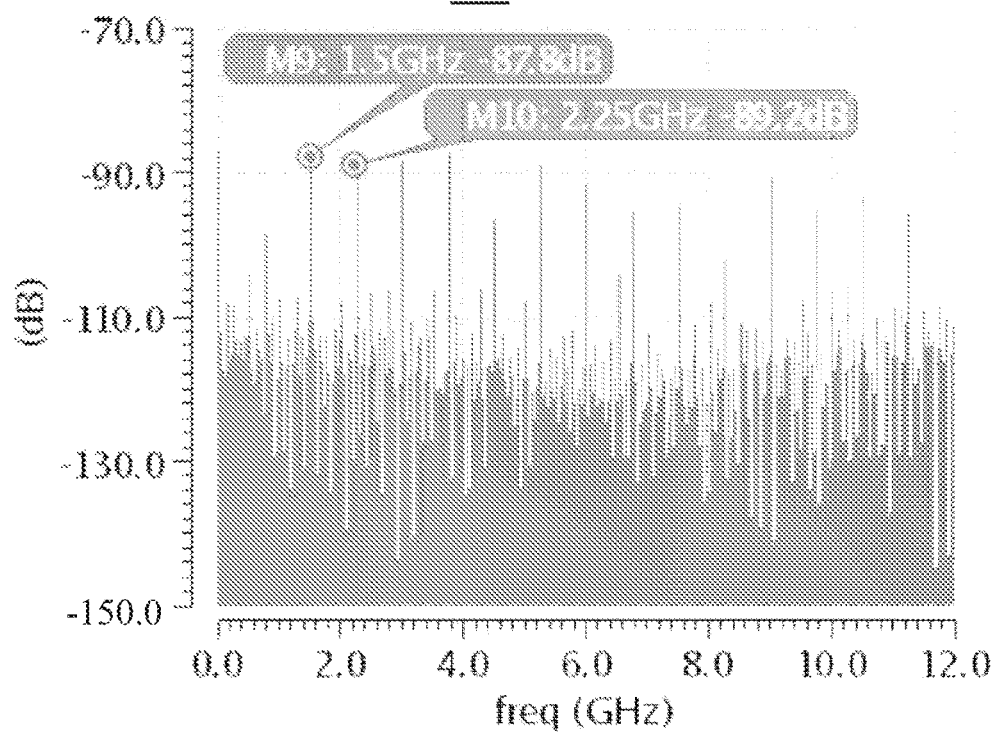

FIG. 14 illustrates plot 1400 showing a simulation of a single sub-ADC load current, and plot 1420 showing Fast Fourier Transform (FFT) of this load current, in accordance with some embodiments. Plot 1400 shows the current load of a single sub-ADC's switched-capacitor DAC in the time domain with an ideal reference voltage. The load has large current spikes when the DAC is reset at the end of each conversion and a spike for each feedback bit. In the frequency domain, this leads to tones at multiples of the ADC sampling frequency of 750 MHz, for example. When several time-interleaved sub-ADCs share the same reference voltage, the reset current of one sub-ADC may occur while another is evaluating sensitive least significant bit (LSB) decisions, reducing ADC performance. This requires larger $C_{decap}$ to attenuate ripple induced by the reset current spike, which can be accomplished by combining $C_{decap}$ from multiple sub-ADCs.

Because the sub-ADC reset current spikes are narrow and evenly spaced in the time domain, the peak current load remains roughly constant with interleaving factor. As a result, increasing the number of interleaved ADCs increases the total $C_{decap}$ available to attenuate each spike. The reduced reset tone amplitude can be seen in FFT of the reference voltage, where the largest tone occurs at multiples of the interleaved ADC sampling frequency: 750 MHz, 1.5 GHz, 3 GHz, and 6 GHz for 1×, 2×, 4×, and 8× interleaving. Increasing the interleaving factor from 1× to 8× decreases the peak tone amplitude by approximately 14 dB. The asynchronous comparator 804 may contribute noise around the approximately 8 GHz clock frequency, in this example, but it does not appear as a single tone spur due to the jitter caused by the asynchronous clocking. Increasing the interleaving factor can improve SNDR for a fixed $C_{decap}$ per ADC. In some examples, 1× interleaving gives better performance than 2× interleaving because the 2×$C_{decap}$ increase is insufficient to account for the performance loss caused by injecting reset noise while the other ADC evaluates sensitive LSB decisions. Performance benefit is observed with greater than 4× interleaving. In the FFT, no significant spurs are observed at the asynchronous comparator switching frequency of ~8 GHz; the reference noise appears wideband. Jitter from the asynchronous clocking spreads this noise across frequency, giving ~60 dB SFDR with 1 pF $C_{decap}$ per ADC.

Figure 15:
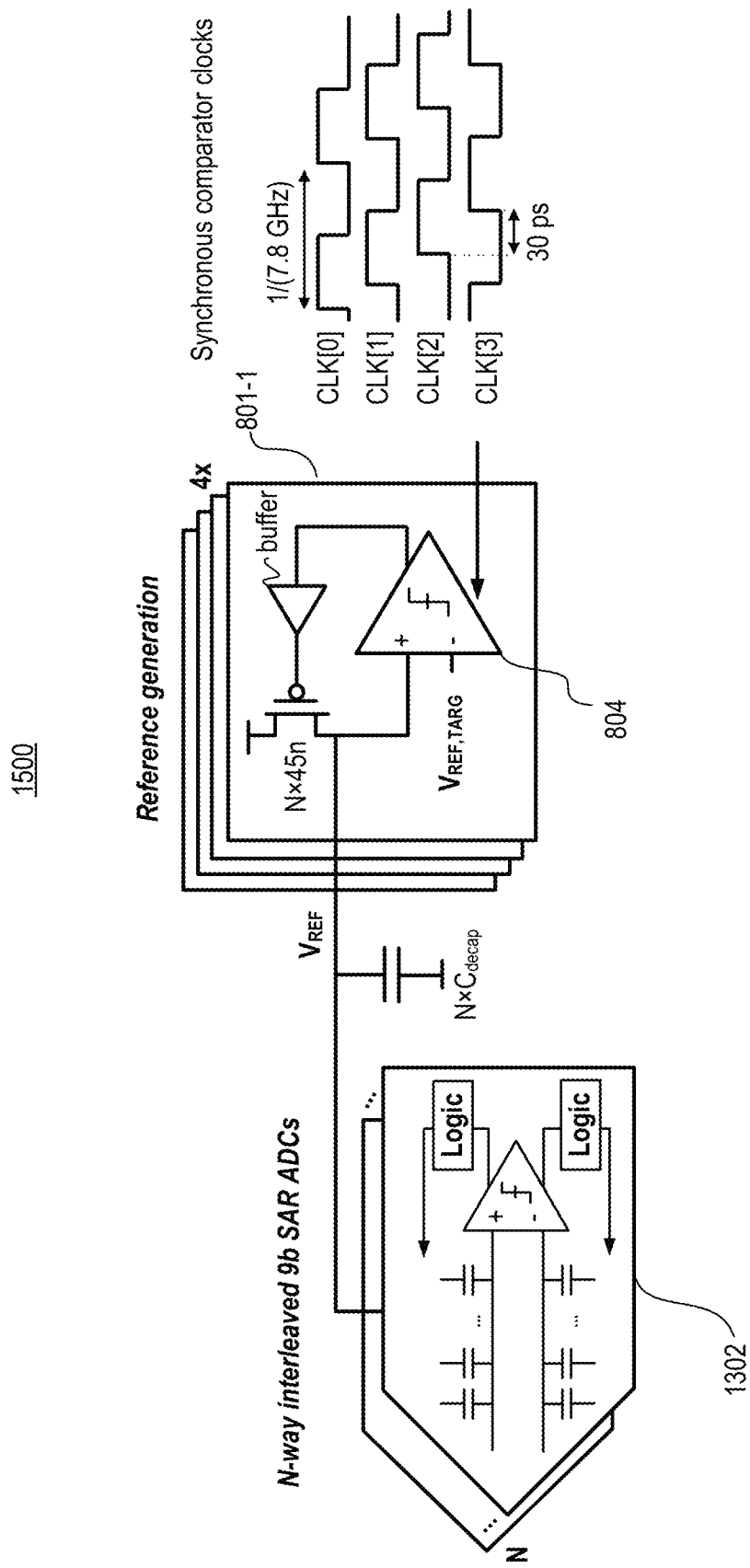
FIG. 15 illustrates circuitry for characterization of an analog-to-digital converter (ADC) having the comparator-based low dropout circuitry using a synchronous clock, in accordance with some embodiments.

FIG. 15 illustrates circuitry 1500 for characterization of an analog-to-digital converter (ADC) having the comparator-based low dropout circuity using a synchronous clock, in accordance with some embodiments. Circuitry 1500 is similar to circuitry 900. In some embodiments, output of comparator 804 drives the p-type devices MP via a buffer. The synchronous interleaved LDO design can provide better SNDR compared to the asynchronous interleaved LDO design at the expense of more distinct spurs at the comparator clock frequency. To characterize this LDO, in one example, each comparator is clocked at 7.8 GHz with clock phases offset by 30 ps. In one example, while the single ADC configuration (1× interleaving) contains spurs, greater than 60 dB is maintained and the SNDR improves by 5 dB relative to the asynchronous LDO case. The 8× interleaving adds wideband noise, but the larger $C_{decap}$ attenuates this noise. With the higher interleaving factor, greater than 66 dB SFDR is observed using 8× interleaving with SNDR similar to the asynchronous LDO implementation.

Overall, the digital LDO technique of various embodiments, in this example, can provide greater than 8b simulated ENOB with 1 pF $C_{decap}$ per sub-ADC and nearly 9b (55 dB SNDR) with 5 pF $C_{decap}$ per sub-ADC; the design may support higher resolutions if $C_{decap}$ is increased. In the asynchronous LDO architecture of FIG. 13, comparator switching noise is spread across frequencies to reduce the level of the comparator clock spur, particularly when the LDO drives a single sub-ADC. In the synchronous architecture of FIG. 15, reference noise is reduced overall and spurs remain less than −60 dBFS. The switching harmonics of the LDO architecture for reference generation of various embodiments do not degrade the ADC performance for moderate resolution applications.

Figure 16:
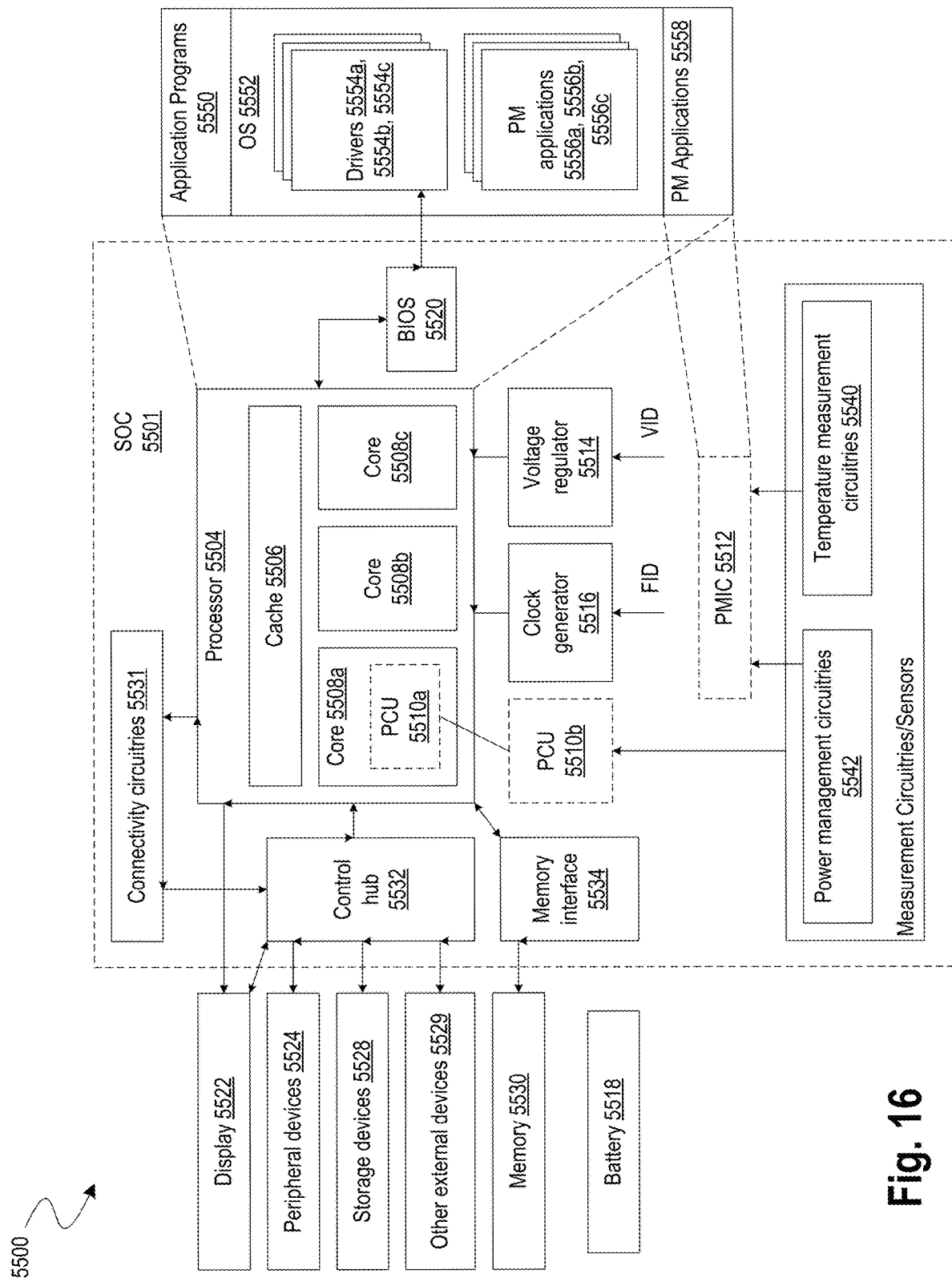
FIG. 16 illustrates a smart device, or a computer system, or an SoC (System-on-Chip) with a TDC and/or a reference generator, according to some embodiments of the disclosure.

FIG. 16 illustrates a smart device, or a computer system, or a SoC (System-on-Chip) with compact pipelined SAR TDC and/or a reference generator (e.g., for capacitive digital-to-analog converters (DACs)), according to some embodiments of the disclosure. It is pointed out that those elements of FIG. 16 having the same reference numbers (or names) as the elements of any other figure may operate or function in any manner similar to that described, but are not limited to such. Any of the blocks here can include the compact pipelined SAR TDC and/or the reference generator of various embodiments In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 16, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 16, processor 5504 may include any other appropriate number of processing cores, e.g., tens or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax or its LTE/5G equivalent), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556a, 5556b, 5556c. The OS 5552 may also include various drivers 5554a, 5554b, 5554c, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510a/b has a capability to enable extra compute and telemetries resources for the runtime support of the pCode. Here pCode refers to a firmware executed by PCU 5510a/b to manage performance of the 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance. Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in the platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect. An interface may include logic and I/O driver/receiver to send and receive data over the interconnect or one or more wires.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a pipeline stage comprising a minimum and a maximum detector which includes an OR gate and an AND gate; a first clock node to provide a first clock to the pipeline stage; and a second clock node to provide a second clock to the pipeline stage, wherein the second clock is phase offset from the first clock, wherein the OR gate and the AND gate are to provide a first indicator indicative of a minimum between the first clock and the second clock, and to provide a second indicator indicative of a maximum between the first clock and the second clock, respectively.

Example 2: The apparatus of example 1, comprising a delay stage coupled to an output of a node that provide the first indicator.

Example 3: The apparatus of example 2, wherein the delay stage has a programmable delay.

Example 4: The apparatus of example 2, wherein the delay stage comprises a delay line.

Example 5: The apparatus of example 2, comprising a comparator coupled to the first clock node and the second clock node, wherein the comparator is to provide an output indicative of whether the first clock is arrives after the second clock in time domain.

Example 6: The apparatus of example 5, wherein the comparator comprises cross-coupled NAND gates.

Example 7: The apparatus of example 5, wherein the comparator comprises cross-coupled NOR gates.

Example 8: The apparatus of example 5, wherein the pipeline stage, the comparator, and the delay stage are part of successive approximation time-to-digital converter.

Example 9: The apparatus of example 2 comprises: a first multiplexer having a first input coupled to an output of the OR gate and second input coupled to an output of the AND gate; a second multiplexer having a first input coupled to an output of the AND gate and second input coupled to an output of the OR gate, wherein the first multiplexer and the second multiplexer are controllable by a select.

Example 10: The apparatus of example 9, wherein an output of the first multiplexer is to provide the first indicator, and wherein an output of the second multiplexer is to provide the second indicator.

Example 11: The apparatus of example 9 comprising a circuitry to generate the select, wherein the circuitry comprises: a second AND gate coupled to the first clock node and the second clock node; a NOR gate coupled to the first clock node and the second clock node; and a flip-flop having a reset input coupled to an output of the AND gate, a clock input coupled to an output of the NOR gate, and an output to provide the select.

Example 12: An apparatus comprising: a plurality of pipeline stages, wherein an individual pipeline stage includes an AND gate and an OR gate to determine whether an early and late edge of first and second clock inputs; a plurality of binary weighted delay stages, wherein an individual binary weighted delay stage is coupled to an input of the individual pipeline stage; and a plurality of comparators, wherein at least a first individual comparator of the plurality of comparators is coupled to inputs of a first individual pipeline stage of the plurality of pipeline stages, wherein an individual comparator of the plurality of comparators is coupled to an output of the individual pipeline stage and an output of the individual binary weighted delay stage.

Example 13: The apparatus of example 12, wherein the individual binary weighted delay stage has a programmable delay.

Example 14: The apparatus of example 12, wherein the individual binary weighted delay stage comprises a delay line.

Example 15: The apparatus of example 12, wherein the individual comparator comprises cross-coupled NAND gates.

Example 16: The apparatus of example 12, wherein the individual comparator comprises cross-coupled NOR gates.

Example 17: A system comprising: a memory to store one or more instructions; a processor circuitry coupled to the memory, wherein the processor circuitry is to execute the one or more instructions; and a communication interface to allow the processor circuitry to communicate with another device, wherein the processor circuitry includes a time-to-digital converter which includes: a plurality of pipeline stages, wherein an individual pipeline stage includes an AND gate and an OR gate to determine whether an early and late edge of first and second clock inputs; a plurality of binary weighted delay stages, wherein an individual binary weighted delay stage is coupled to an input of the individual pipeline stage; and a plurality of comparators, wherein at least a first individual comparator of the plurality of comparators is coupled to inputs of a first individual pipeline stage of the plurality of pipeline stages, wherein an individual comparator of the plurality of comparators is coupled to an output of the individual pipeline stage and an output of the individual binary weighted delay stage.

Example 18: The system of example 17, wherein the individual binary weighted delay stage has a programmable delay.

Example 19: The system of example 17, wherein the individual binary weighted delay stage comprises a delay line.

Example 20: The system of example 17, wherein the individual comparator comprises cross-coupled NAND gates, or wherein the individual comparator comprises cross-coupled NOR gates.

Example 21: An apparatus comprising: a plurality of low dropout circuitries coupled in parallel and connected to a reference node that provides a reference voltage; and a decoupling capacitor coupled to the reference node and a ground node, wherein an individual low dropout circuitry of the plurality of low dropout circuitries includes: a comparator that compares the reference voltage with a target voltage; and a power device controllable by an output of the comparator, wherein the power device adjusts the reference voltage, wherein the comparator is clocked by an asynchronous clock.

Example 22: The apparatus of example 21, wherein the individual low dropout circuitry comprises logic to generate the asynchronous clock.

Example 23: The apparatus of example 22, wherein the logic includes an XOR gate.

Example 24: The apparatus of example 22, wherein the power device comprises a p-type device, wherein the logic is to reset the output of the comparator to a logic high-level at a rising edge of the asynchronous clock if the reference voltage is less than the target voltage.

Example 25: The apparatus of example 21, wherein each of the plurality of low dropout circuitries includes a logic to stagger the asynchronous clock of a corresponding low dropout circuitry.

Example 26: The apparatus of example 21 comprises a digital-to-analog converter (DAC) coupled to the reference node.

Example 27: The apparatus of example 26, wherein the DAC is part of a successive approximation (SAR) analog-to-digital converter (ADC).

Example 28: The apparatus of example 21, wherein the comparator comprises a strong arm latch.

Example 29: An apparatus comprising: a plurality of low dropout circuitries coupled in parallel and connected to a reference node that provides a reference voltage; and a decoupling capacitor coupled to the reference node and a ground node, wherein an individual low dropout circuitry of the plurality of low dropout circuitries includes: a comparator that compares the reference voltage with a target voltage; and a power device controllable by an output of the comparator, wherein the power device adjusts the reference voltage, wherein the comparator is clocked by a synchronous clock.

Example 30: The apparatus of example 29 comprises an oscillator to generate the synchronous clock.

Example 31: The apparatus of example 30, wherein the oscillator comprises inverters coupled in a ring formation, wherein a comparator of each of the plurality of low dropout circuitries is clocked by an output of an individual inverter from among the inverters of the oscillator.

Example 32: The apparatus of example 29, wherein the comparator comprises a strong arm latch.

Example 33: The apparatus of example 29 comprises a digital-to-analog converter (DAC) coupled to the reference node.

Example 34: The apparatus of example 33, wherein the DAC is part of a successive approximation (SAR) analog-to-digital converter (ADC).

Example 35: A system comprising: a memory to store one or more instructions; a processor circuitry to execute one or more instructions; and a communication interface to allow the processor circuitry to communicate with one or more devices, wherein the processor circuitry includes a reference voltage generator which includes: a plurality of low dropout circuitries coupled in parallel and connected to a reference node that provides a reference voltage; and a decoupling capacitor coupled to the reference node and a ground node, wherein an individual low dropout circuitry of the plurality of low dropout circuitries includes: a comparator that compares the reference voltage with a target voltage; and a power device controllable by an output of the comparator, wherein the power device adjusts the reference voltage, wherein the comparator is clocked by an asynchronous clock.

Example 36: The system of example 35, wherein the individual low dropout circuitry comprises logic to generate the asynchronous clock.

Example 37: The system of example 36, wherein the logic includes an XOR gate.

Example 38: The system of example 36, wherein the power device comprises a p-type device, wherein the logic is to reset the output of the comparator to a logic high-level at a rising edge of the asynchronous clock if the reference voltage is less than the target voltage.

Example 39: The system of example 35, wherein each of the plurality of low dropout circuitries includes a logic to stagger the asynchronous clock of a corresponding low dropout circuitry.

Example 40: The system of example 35, wherein the processor circuitry comprises a digital-to-analog converter (DAC) coupled to the reference node.

Example 41: The system of example 40, wherein the DAC is part of a successive approximation (SAR) analog-to-digital converter (ADC).

Example 42: The system of example 35, wherein the comparator comprises a strong arm latch.

Example 43: A system comprising: a memory to store one or more instructions; a processor circuitry to execute one or more instructions; and a communication interface to allow the processor circuitry to communicate with one or more devices, wherein the processor circuitry includes a reference voltage generator which includes: a plurality of low dropout circuitries coupled in parallel and connected to a reference node that provides a reference voltage; and a decoupling capacitor coupled to the reference node and a ground node, wherein an individual low dropout circuitry of the plurality of low dropout circuitries includes: a comparator that compares the reference voltage with a target voltage; and a power device controllable by an output of the comparator, wherein the power device adjusts the reference voltage, wherein the comparator is clocked by a synchronous clock.

Example 44: The system of example 43, wherein the processor circuitry comprises an oscillator to generate the synchronous clock.

Example 45: The system of example 44, wherein the oscillator comprises inverters coupled in a ring formation, wherein a comparator of each of the plurality of low dropout circuitries is clocked by an output of an individual inverter from among the inverters of the oscillator.

Example 46: The system of example 43, wherein the comparator comprises a strong arm latch.

Example 47: The system of example 43, wherein the processor circuitry comprises a digital-to-analog converter (DAC) coupled to the reference node.

Example 48: The system of example 47, wherein the DAC is part of a successive approximation (SAR) analog-to-digital converter (ADC).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    a pipeline stage comprising a minimum and a maximum detector which includes an OR gate and an AND gate;
    a first clock node to provide a first clock to the pipeline stage; and
    a second clock node to provide a second clock to the pipeline stage, wherein the second clock is phase offset from the first clock, wherein the OR gate and the AND gate are to provide a first indicator indicative of a minimum between the first clock and the second clock, and to provide a second indicator indicative of a maximum between the first clock and the second clock, respectively.

2. The apparatus of claim 1, comprising a delay stage coupled to an output of a node that provide the first indicator.

3. The apparatus of claim 2, wherein the delay stage has a programmable delay.

4. The apparatus of claim 2, wherein the delay stage comprises a delay line.

5. The apparatus of claim 2, comprising a comparator coupled to the first clock node and the second clock node, wherein the comparator is to provide an output indicative of whether the first clock arrives after the second clock in time domain.

6. The apparatus of claim 5, wherein the comparator comprises cross-coupled NAND gates.

7. The apparatus of claim 5, wherein the comparator comprises cross-coupled NOR gates.

8. The apparatus of claim 5, wherein the pipeline stage, the comparator, and the delay stage are part of a successive approximation time-to-digital converter.

9. The apparatus of claim 2 comprises:
    a first multiplexer having a first input coupled to an output of the OR gate and second input coupled to an output of the AND gate; and
    a second multiplexer having a first input coupled to an output of the AND gate and second input coupled to an output of the OR gate, wherein the first multiplexer and the second multiplexer are controllable by a select.

10. The apparatus of claim 9, wherein an output of the first multiplexer is to provide the first indicator, and wherein an output of the second multiplexer is to provide the second indicator.

11. The apparatus of claim 9 comprising a circuitry to generate the select, wherein the circuitry comprises:
    a second AND gate coupled to the first clock node and the second clock node;
    a NOR gate coupled to the first clock node and the second clock node; and
    a flip-flop having a reset input coupled to an output of the AND gate, a clock input coupled to an output of the NOR gate, and an output to provide the select.

12. An apparatus comprising:
    a plurality of pipeline stages, wherein an individual pipeline stage includes an AND gate and an OR gate to determine an early and late edge of first and second clock inputs;
    a plurality of binary weighted delay stages, wherein an individual binary weighted delay stage is coupled to an input of the individual pipeline stage; and
    a plurality of comparators, wherein at least a first individual comparator of the plurality of comparators is coupled to inputs of a first individual pipeline stage of the plurality of pipeline stages, wherein an individual comparator of the plurality of comparators is coupled to an output of the individual pipeline stage and an output of the individual binary weighted delay stage.

13. The apparatus of claim 12, wherein the individual binary weighted delay stage has a programmable delay.

14. The apparatus of claim 12, wherein the individual binary weighted delay stage comprises a delay line.

15. The apparatus of claim 12, wherein the individual comparator comprises cross-coupled NAND gates.

16. The apparatus of claim 12, wherein the individual comparator comprises cross-coupled NOR gates.

17. A system comprising:
    a memory to store one or more instructions;
    a processor circuitry coupled to the memory, wherein the processor circuitry is to execute the one or more instructions;
    a communication interface to allow the processor circuitry to communicate with another device, wherein the processor circuitry includes a time-to-digital converter which includes:
    a plurality of pipeline stages, wherein an individual pipeline stage includes an AND gate and an OR gate to determine an early and late edge of first and second clock inputs;
    a plurality of binary weighted delay stages, wherein an individual binary weighted delay stage is coupled to an input of the individual pipeline stage; and
    a plurality of comparators, wherein at least a first individual comparator of the plurality of comparators is coupled to inputs of a first individual pipeline stage of the plurality of pipeline stages, wherein an individual comparator of the plurality of comparators is coupled to an output of the individual pipeline stage and an output of the individual binary weighted delay stage.

18. The system of claim 17, wherein the individual binary weighted delay stage has a programmable delay.

19. The system of claim 17, wherein the individual binary weighted delay stage comprises a delay line.

20. The system of claim 17, wherein the individual comparator comprises cross-coupled NAND gates, or wherein the individual comparator comprises cross-coupled NOR gates.

* * * * *